US010274767B2

(12) United States Patent
Ohara

(10) Patent No.: US 10,274,767 B2
(45) Date of Patent: Apr. 30, 2019

(54) DISPLAY DEVICE AND METHOD OF MANUFACTURING THE SAME

(71) Applicant: Japan Display Inc., Tokyo (JP)

(72) Inventor: Hiroki Ohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 13 days.

(21) Appl. No.: 15/649,715

(22) Filed: Jul. 14, 2017

(65) Prior Publication Data

US 2018/0088390 A1 Mar. 29, 2018

(30) Foreign Application Priority Data

Sep. 26, 2016 (JP) .................................. 2016-186627

(51) Int. Cl.
*G02F 1/1337* (2006.01)
*G02F 1/1333* (2006.01)
*G02F 1/1335* (2006.01)
*H01L 51/50* (2006.01)
*H01L 51/00* (2006.01)
*H01L 27/32* (2006.01)

(52) U.S. Cl.
CPC .. *G02F 1/133305* (2013.01); *G02F 1/133516* (2013.01); *H01L 27/3276* (2013.01); *H01L 51/0097* (2013.01); *H01L 51/5068* (2013.01); *H01L 51/5088* (2013.01); *G02F 2001/133792* (2013.01); *H01L 2251/5338* (2013.01)

(58) Field of Classification Search
CPC ............. G02F 1/13454; G02F 1/13458; G02F 1/133305
See application file for complete search history.

(56) References Cited

U.S. PATENT DOCUMENTS

2016/0066409 A1\* 3/2016 Kwon .................... H05K 1/028
174/254

FOREIGN PATENT DOCUMENTS

JP 2009-177071 A 8/2009

\* cited by examiner

*Primary Examiner* — Phu Vu
(74) *Attorney, Agent, or Firm* — Typha IP LLC

(57) ABSTRACT

There is provided a display device including a flexible substrate having a first surface and a second surface opposite to the first surface, the substrate including a display region on the first surface and a bending region on a part of the first surface or on a part of the second surface, the display region being arranged with a plurality of pixels, the bending region including an uneven pattern alternately arranged with regions, the thickness of the substrate being different in each region; and a plurality of wirings transmitting a signal for driving the plurality of pixels, each of the plurality of wirings being arranged in a top part or a bottom part of a convex portion in the uneven pattern in the bending region.

6 Claims, 23 Drawing Sheets

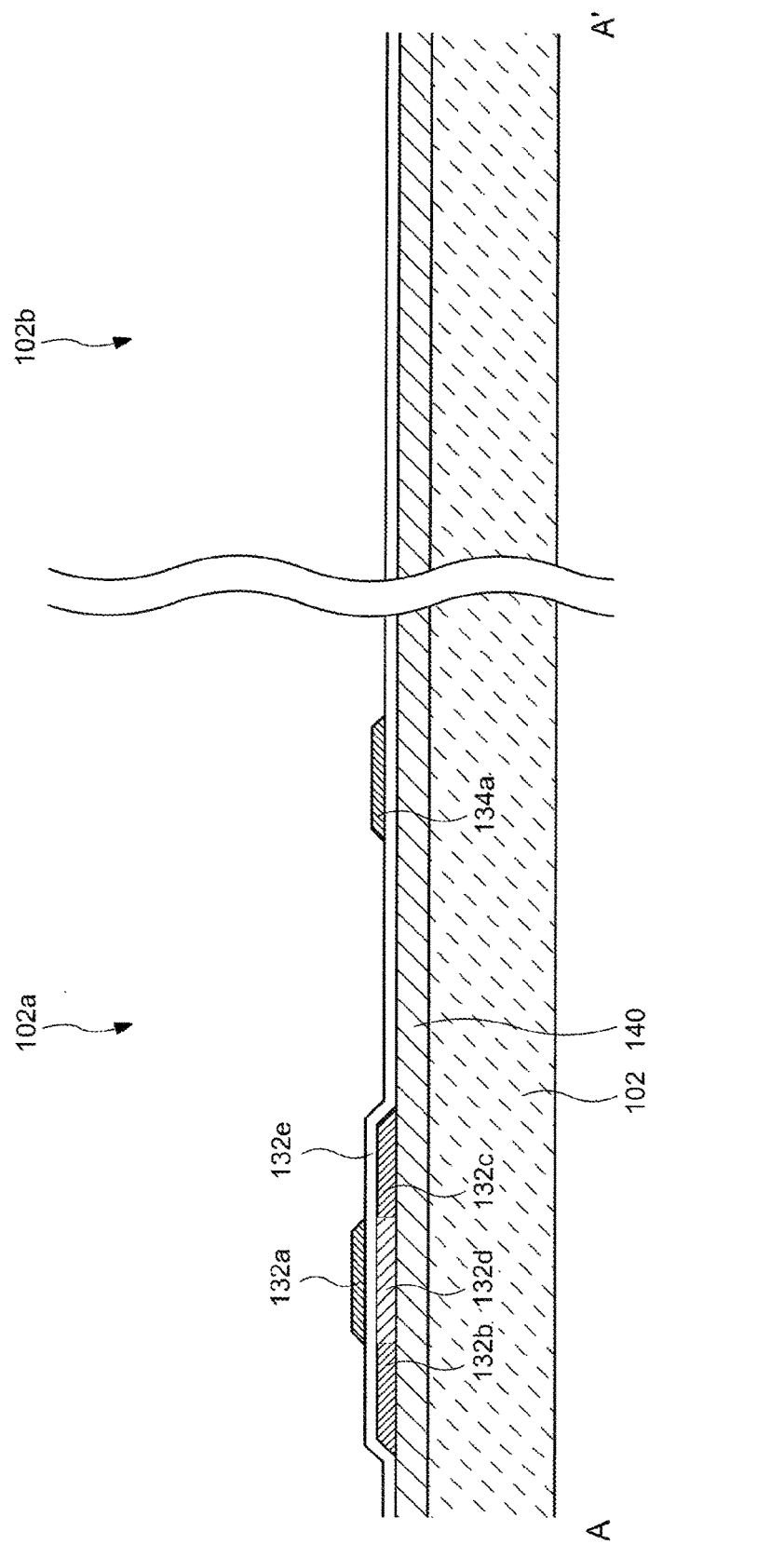

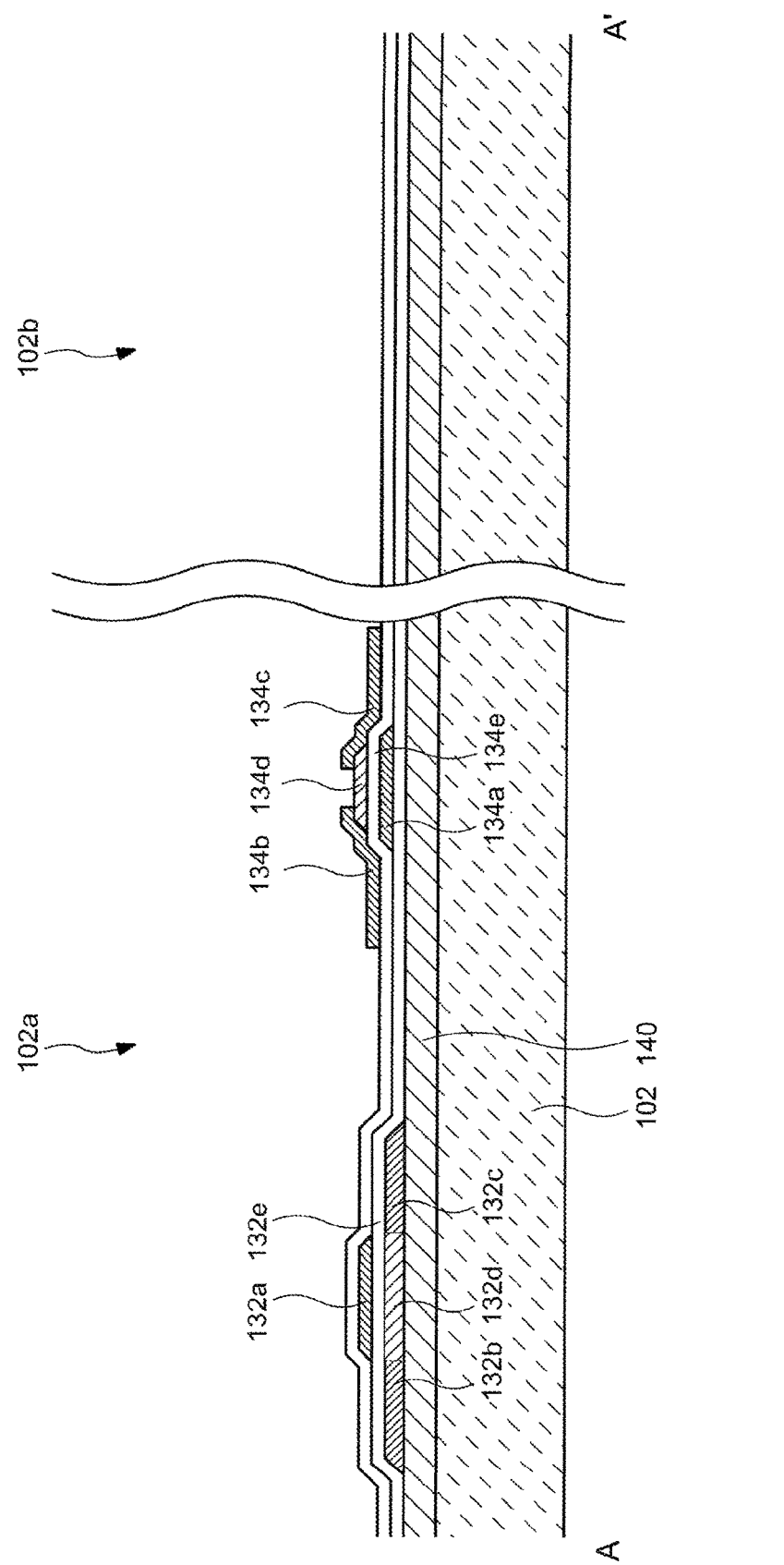

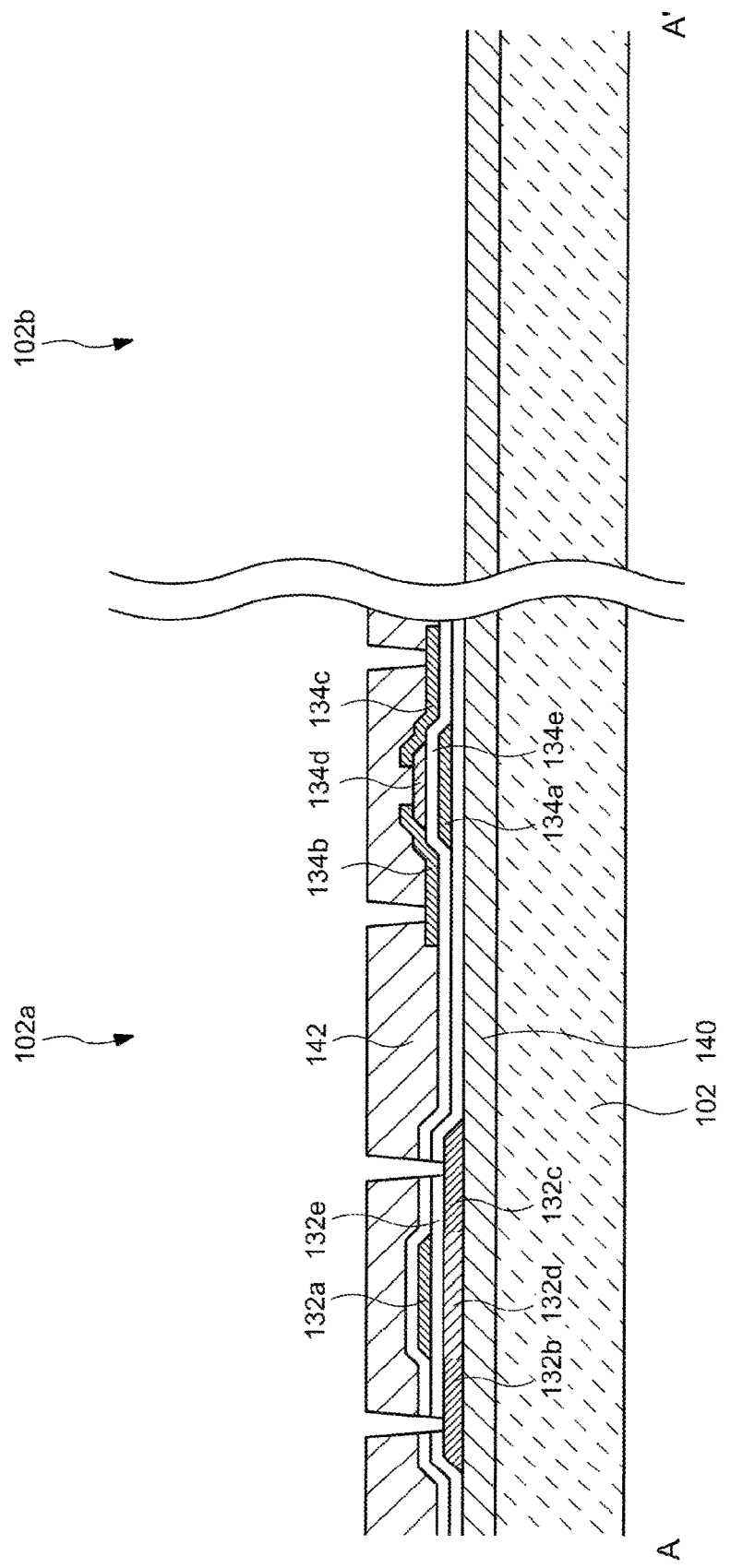

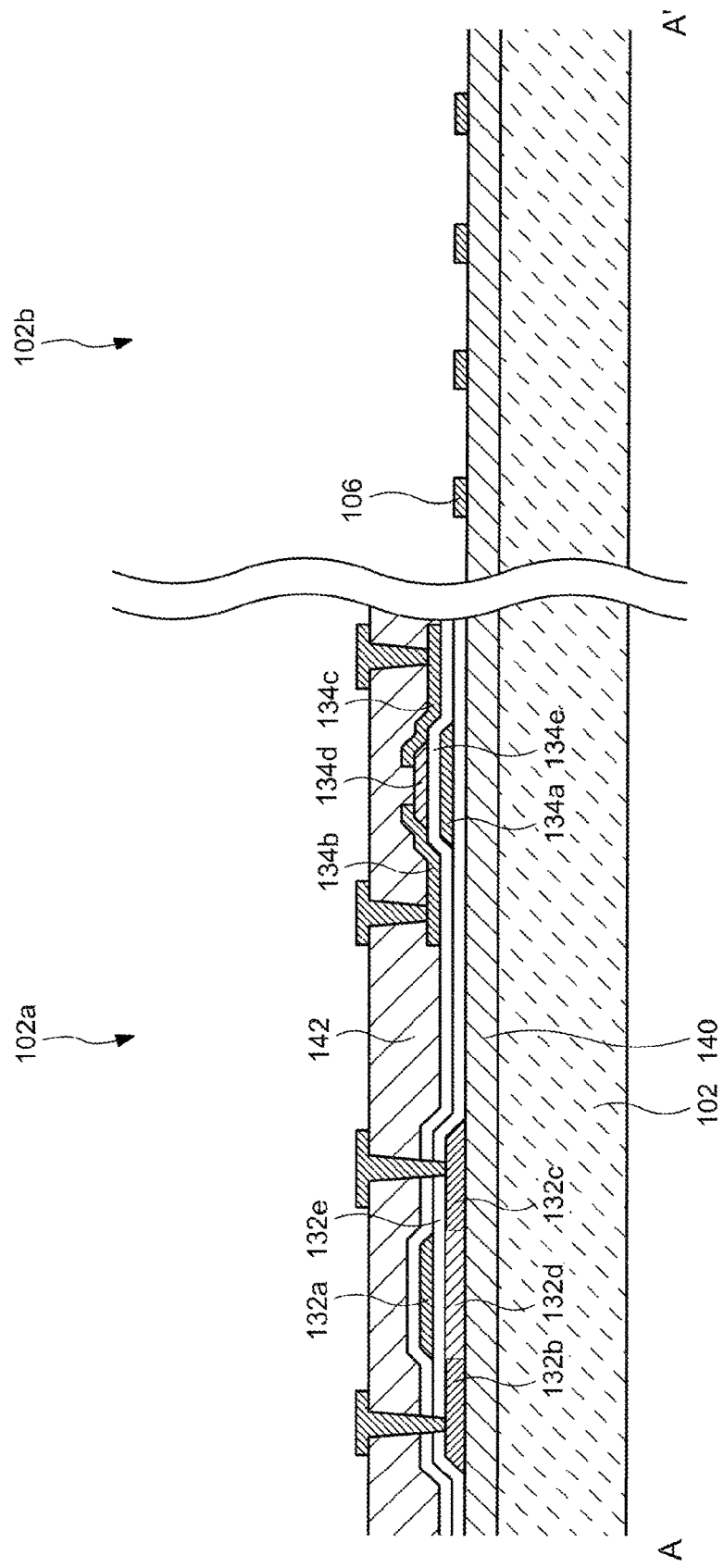

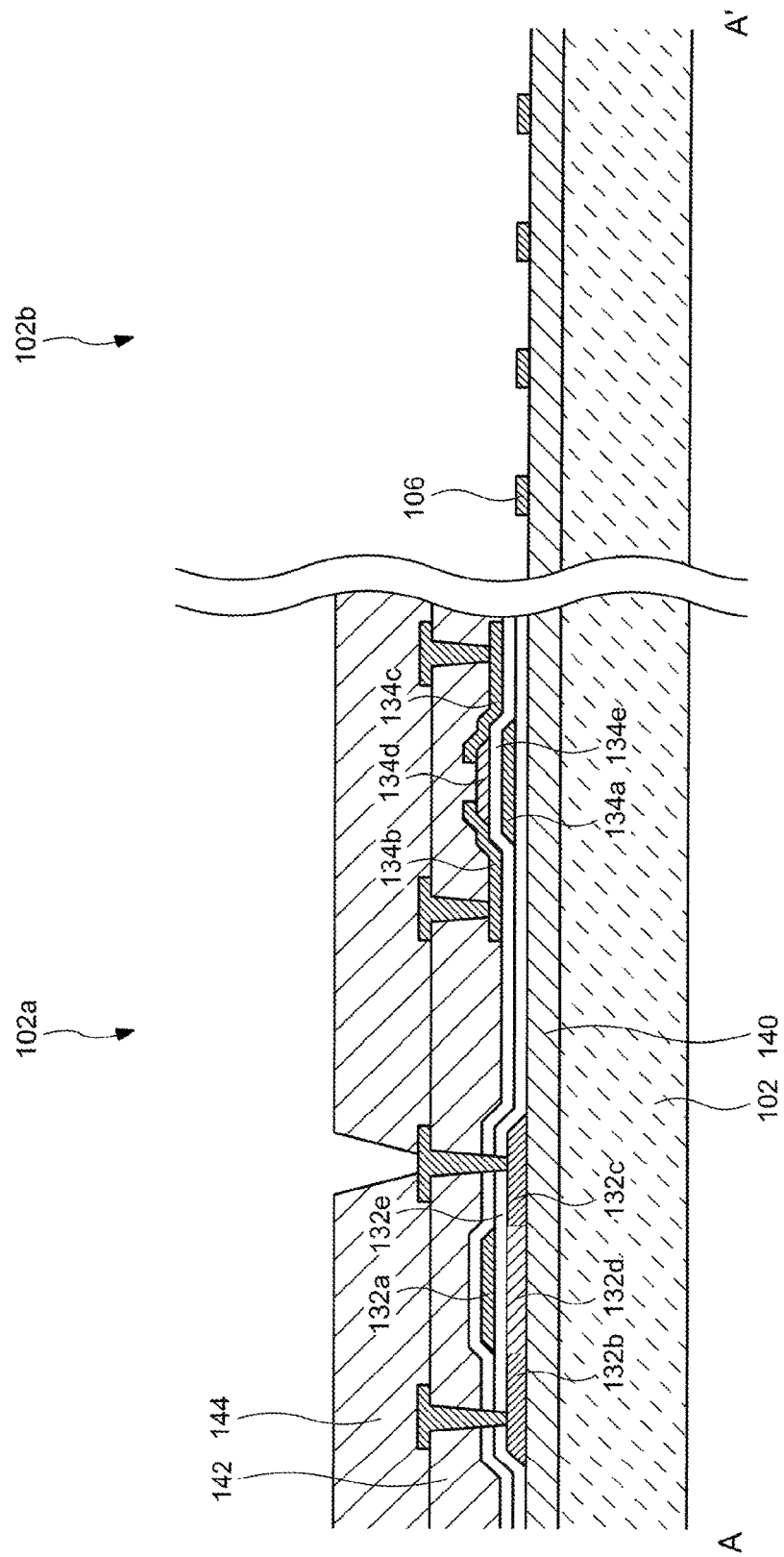

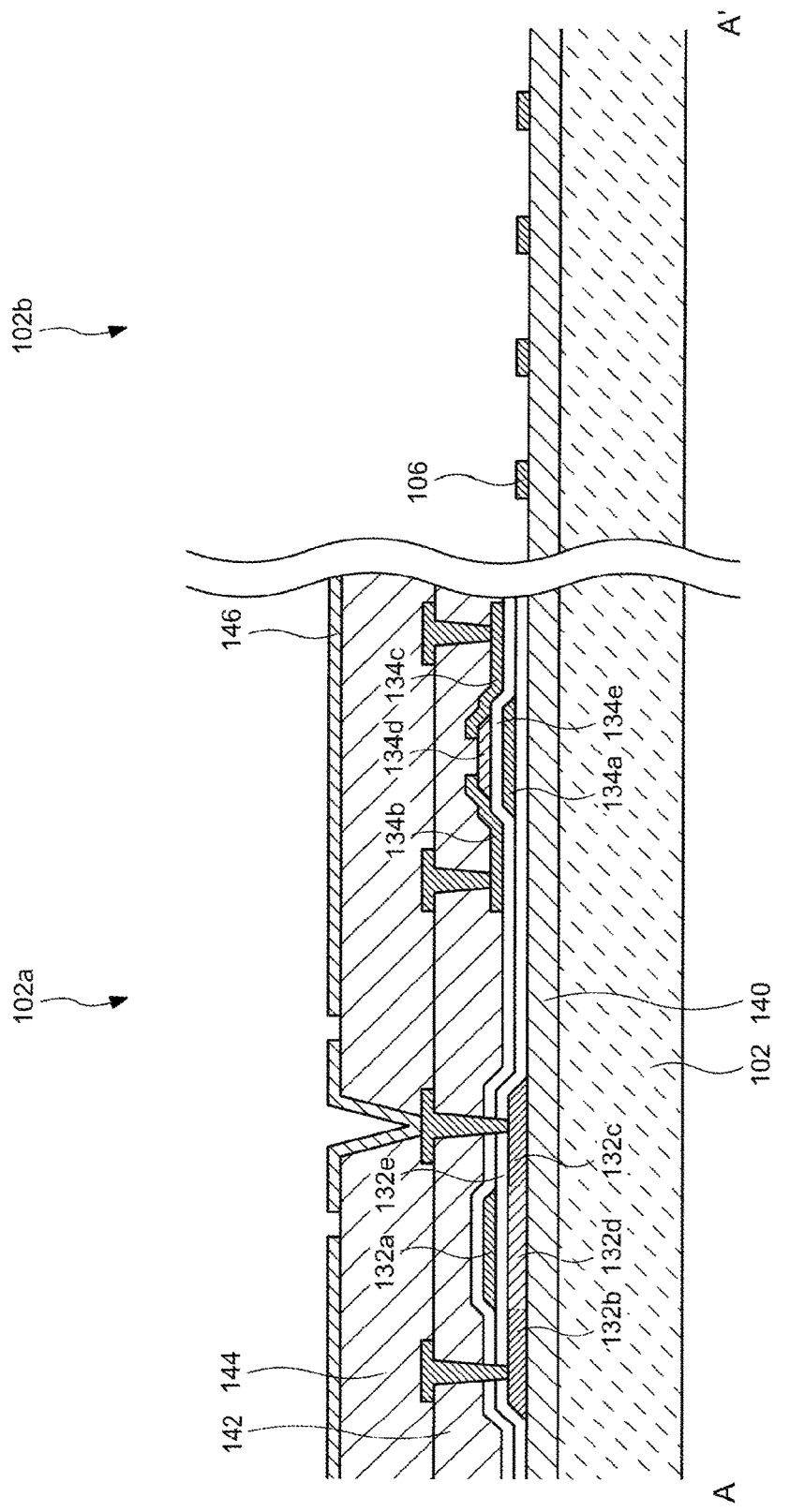

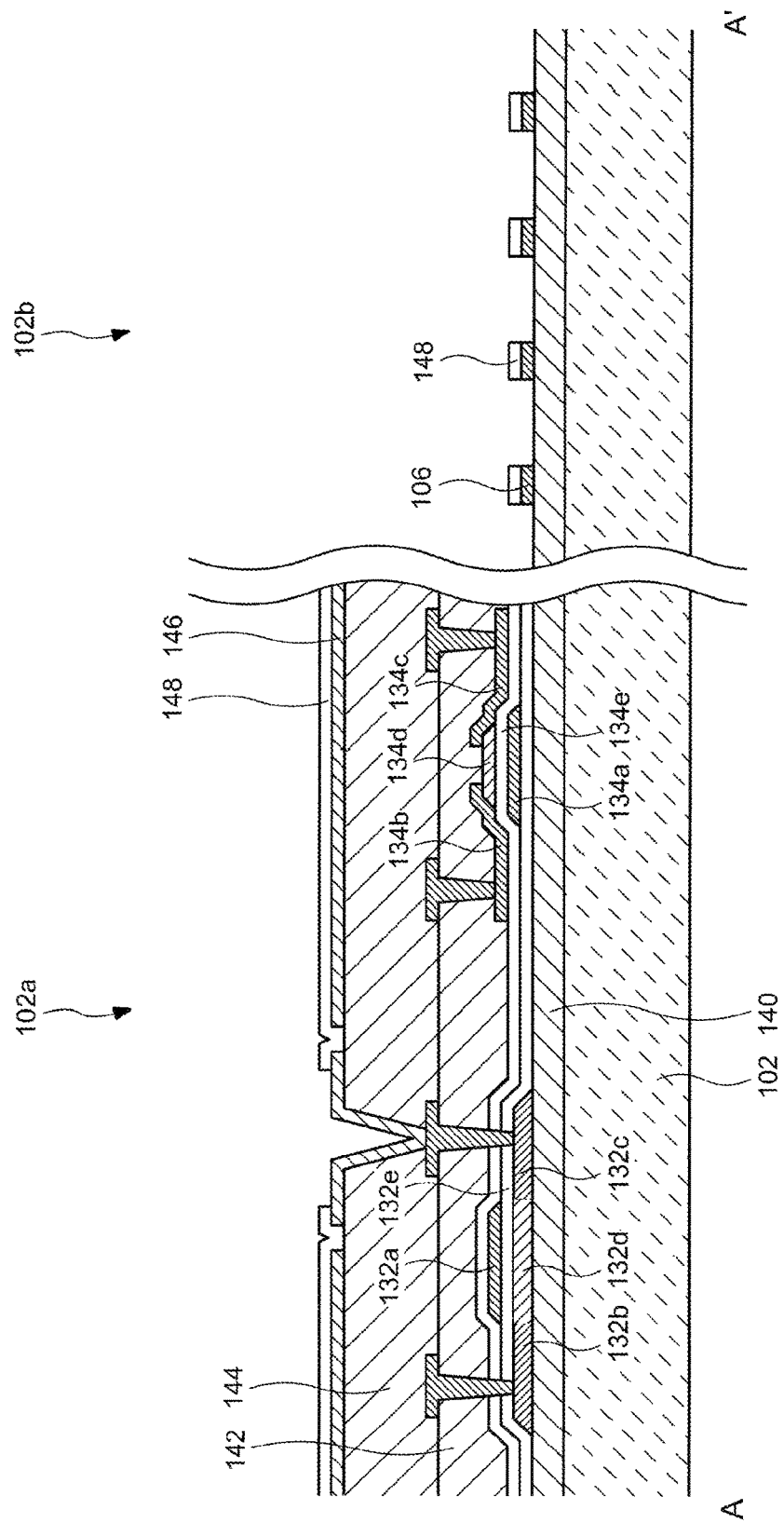

DISPLAY DEVICE AND METHOD OF MANUFACTURING THE SAME

CROSS-REFERENCE TO RELATED APPLICATIONS

This application is based upon and claims the benefit of priority from the prior Japanese Patent Application No.2016-186627, filed on Sep. 26, 2016, the entire contents of which are incorporated herein by reference.

FIELD

The present invention relates to a display device. Particularly, it relates to a configuration of a wiring in the display device.

BACKGROUND

An organic electroluminescence (hereinafter referred to as "organic EL") display device includes light emitting elements respectively corresponding to pixels, and individually controls light emission of the pixels to display an image. The light emitting element includes an anode, a cathode, and a layer containing an organic EL material (hereinafter also referred to as "light emitting layer") sandwiched between the anode and the cathode. When electrons and holes are respectively injected from the cathode and the anode into the light emitting layer, the electrons and the holes are recombined with each other. By excessive energy released thereby, light emitting molecules included in the light emitting layer are excited, and are then deexcited, to emit light.

In the organic EL display device, the anode and the cathode of each of the light emitting elements are respectively provided as a pixel electrode for each of the pixels and provided as a common electrode to which a common potential is applied across the plurality of pixels. The organic EL display device controls the light emission of the pixels by applying a potential of the pixel electrode for each of the pixels to the potential of the common electrode.

In recent years, a foldable flexible display device has been actively developed. A support substrate in the flexible display device is easily cracked because a stress is concentrated on a folded site.

For example, Japanese Patent Application Laid-Open No. 2009-177071 discloses a polyimide film circuit board and a method of manufacturing the same. Thus, a metal wiring circuit pattern is formed on both surfaces or one surface of a copper-clad polyimide base material using a semi-additive method or a subtractive method. Then, the metal wiring circuit pattern portion is reinforced by being coated with heat-resistant insulating resin. Further, when a polyimide base material portion where a metal wiring circuit is not formed is thin-filmed by chemical etching, a polyimide insulating layer having different film thicknesses in the same substrate is formed.

The invention discussed in the above-described document relates to an improvement in processes for mounting various types of components on a flexible printed circuit board. According to the present invention, only a portion of a base material is thinned so that high dimensional stability can be ensured even if the base material is thin while high adaptability to a junction electronic device or the like can be ensured. On the other hand, the present invention does not cover a foldable flexible display device.

SUMMARY

According to an aspect of the present invention, there is provided a display device including a flexible substrate having a first surface and a second surface opposite to the first surface, the substrate including a display region on the first surface and a bending region on a part of the first surface or on a part of the second surface, the display region being arranged with a plurality of pixels, the bending region including an uneven pattern alternately arranged with regions, the thickness of the substrate being different in each region; and a plurality of wirings transmitting a signal for driving the plurality of pixels, each of the plurality of wirings being arranged in a top part or a bottom part of a convex portion in the uneven pattern in the bending region.

According to another aspect of the present invention, there is provided a method of manufacturing a display device, the method including forming a plurality of wirings on a first surface of a flexible substrate, the substrate having the first surface and a second surface opposite to the first surface and including a first region and a second region, each of the plurality of wirings transmitting a signal for driving a plurality of pixels arranged in the first region; and forming an uneven pattern in the substrate by etching regions respectively corresponding to areas among the plurality of wirings from a side of the first surface or a side of the second surface in the second region.

BRIEF DESCRIPTION OF DRAWINGS

FIG. 7B is a cross-sectional view illustrating a method of manufacturing the display device according to the first embodiment of the present invention;

FIG. 7D is a cross-sectional view illustrating a method of manufacturing the display device according to the first embodiment of the present invention;

FIG. 7E is a cross-sectional view illustrating a method of manufacturing the display device according to the first embodiment of the present invention;

FIG. 7F is a cross-sectional view illustrating a method of manufacturing the display device according to the first embodiment of the present invention;

FIG. 7G is a cross-sectional view illustrating a method of manufacturing the display device according to the first embodiment of the present invention;

FIG. 7H is a cross-sectional view illustrating a method of manufacturing the display device according to the first embodiment of the present invention;

FIG. 7I is a cross-sectional view illustrating a method of manufacturing the display device according to the first embodiment of the present invention;

DESCRIPTION OF EMBODIMENTS

Figure 1:
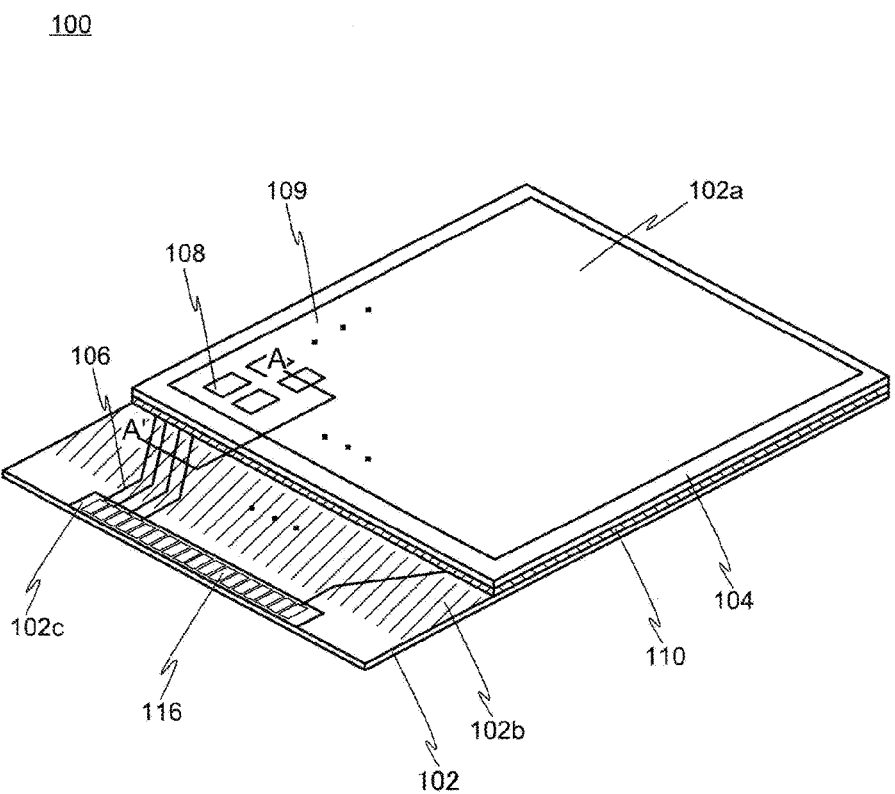
FIG. 1 is a perspective view illustrating a configuration of a display device according to a first embodiment of the present invention.

Embodiments of the present invention will hereinafter be described with reference to the drawings. However, the present invention can be implemented in many different modes, and is not to be interpreted as being limited to contents of description of embodiments illustrated below. While the width, the thickness, the shape, and the like of each of portions in the drawings may be more schematically indicated than those in an actual mode to make the description clearer, this is only one example, and is not to limit the interpretation of the present invention. In the present specification and the drawings, detailed description may be omitted, as needed, by assigning similar elements to those described above with reference to the already described drawings the same reference signs.

In the present specification, when a member or region exists "on (or under)" another member or region, this includes not only a case where the member or region exists just above (or just below) the other member or region but also a case where the member or region exists above (or below) the other member or region, i.e., includes a case where another component is included between the member or region above (or below) the other member or region and the other member or region except as otherwise limited.

<First Embodiment>

A schematic configuration, a circuit configuration, and a detailed configuration of a display device 100 according to the present embodiment and a method of manufacturing the same will be described with reference to the drawings.

By a configuration described below, there can be provided a display device 100 having superior flexibility, including a support substrate which is not easily cracked when bent, and having high reliability.

[Schematic Configuration]

FIG. 1 is a perspective view illustrating a configuration of a display device 100 according to the present embodiment. The display device 100 according to the present embodiment includes a first substrate 102, a second substrate 104, a plurality of pixels 108, a plurality of wirings 106, and a plurality of connection terminals 116.

The first substrate 102 has flexibility. A display region 102a, a bending region 102b, and a terminal region 102c, described below, are provided on one surface of the first substrate 102. A resin material is used as the substrate having flexibility. As the resin material, a macromolecular material including an imide bond in its repeating unit is preferably used, e.g., polyimide is used. More specifically, a film substrate obtained by molding polyimide in a sheet shape is used as the first substrate 102.

The plurality of pixels 108 are arranged on the first substrate 102. A region where the plurality of pixels 108 are arranged is the display region 102a. Each of the plurality of pixels 108 includes a pixel circuit including at least a selection transistor, a driving transistor, a light emitting element, and a capacitor, details of which will be described below.

Each of the plurality of wirings 106 is provided on the first substrate 102. The plurality of wirings 106 are respectively connected to the plurality of connection terminals 116, and each of the plurality of wirings 106 transmits a signal for driving the plurality of pixels 108.

The second substrate 104 has flexibility. As the substrate having flexibility, a similar substrate to the first substrate 102 can be used. The second substrate 104 is provided to oppose the first substrate 102 on an upper surface of the display region 102a. The second substrate 104 is fixed to the first substrate 102 with a sealing material 110 surrounding the display region 102a. The display region 102a arranged in the first substrate 102 is sealed not to be exposed to atmospheric air by the second substrate 104 and the sealing material 110. Such a sealing structure inhibits the light emitting element provided in each of the plurality of pixels 108 from deteriorating. A method of fixing the first substrate 102 and the second substrate 104 need not be a method using the sealing material 110. For example, an adhesive material different from the sealing material 110 may be provided in the whole or a part of an area between the first substrate 102 and the second substrate 104. The first substrate 102 and the second substrate 104 may be fixed to each other using another method.

The plurality of connection terminals 116 are arranged at one end of the first substrate 102 and outside the second substrate 104. A region where the plurality of connection terminals 116 are provided is the terminal region 102c. A wiring substrate 152 (illustrated in FIG. 2), which connects equipment or a power supply which outputs a video signal and the display device 100, is arranged in the plurality of connection terminals 116. Respective contacts of the plurality of connection terminals 116 are exposed to the outside, and are connected to the wiring substrate 152.

Figure 2:
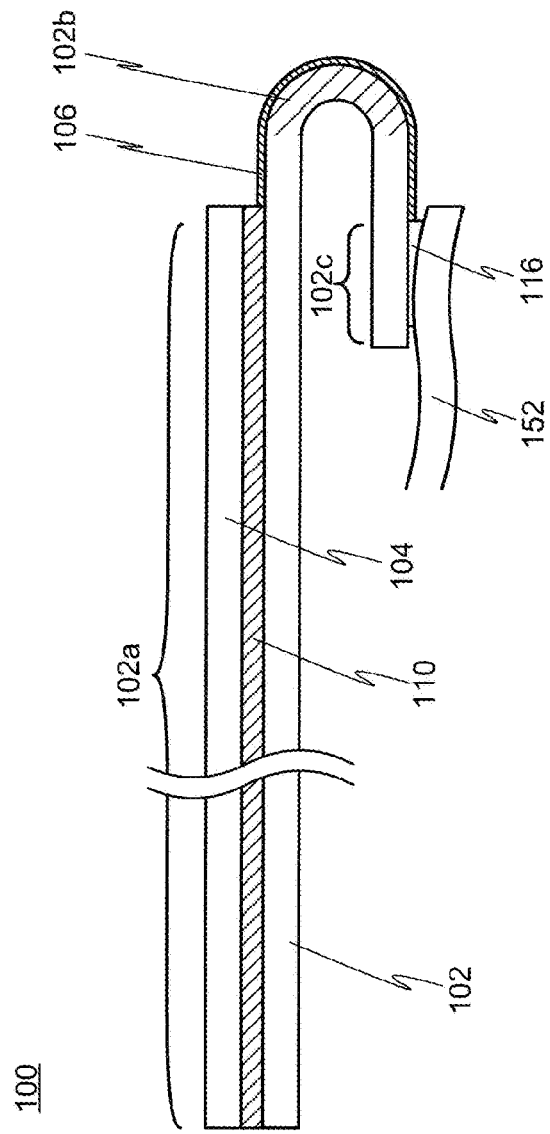
FIG. 2 is a side view of a folded state illustrating the configuration of the display device according to the first embodiment of the present invention.

FIG. 2 is a side view of a folded state illustrating the configuration of the display device 100 according to the present embodiment. As illustrated in FIG. 1, the display device 100 according to the present embodiment includes the bending region 102b between the display region 102a and the terminal region 102c. When the bending region 102b is folded, the display device 100 can be folded so that the terminal region 102c and the display region 102a overlap each other, as illustrated in FIG. 2.

The schematic configuration of the display device 100 according to the present embodiment has been described above. The circuit configuration of the display device 100 according to the present embodiment and a circuit configuration of a pixel circuit 130 included in each of the plurality of pixels 108 will be described below.

[Circuit Configuration]

Figure 3:
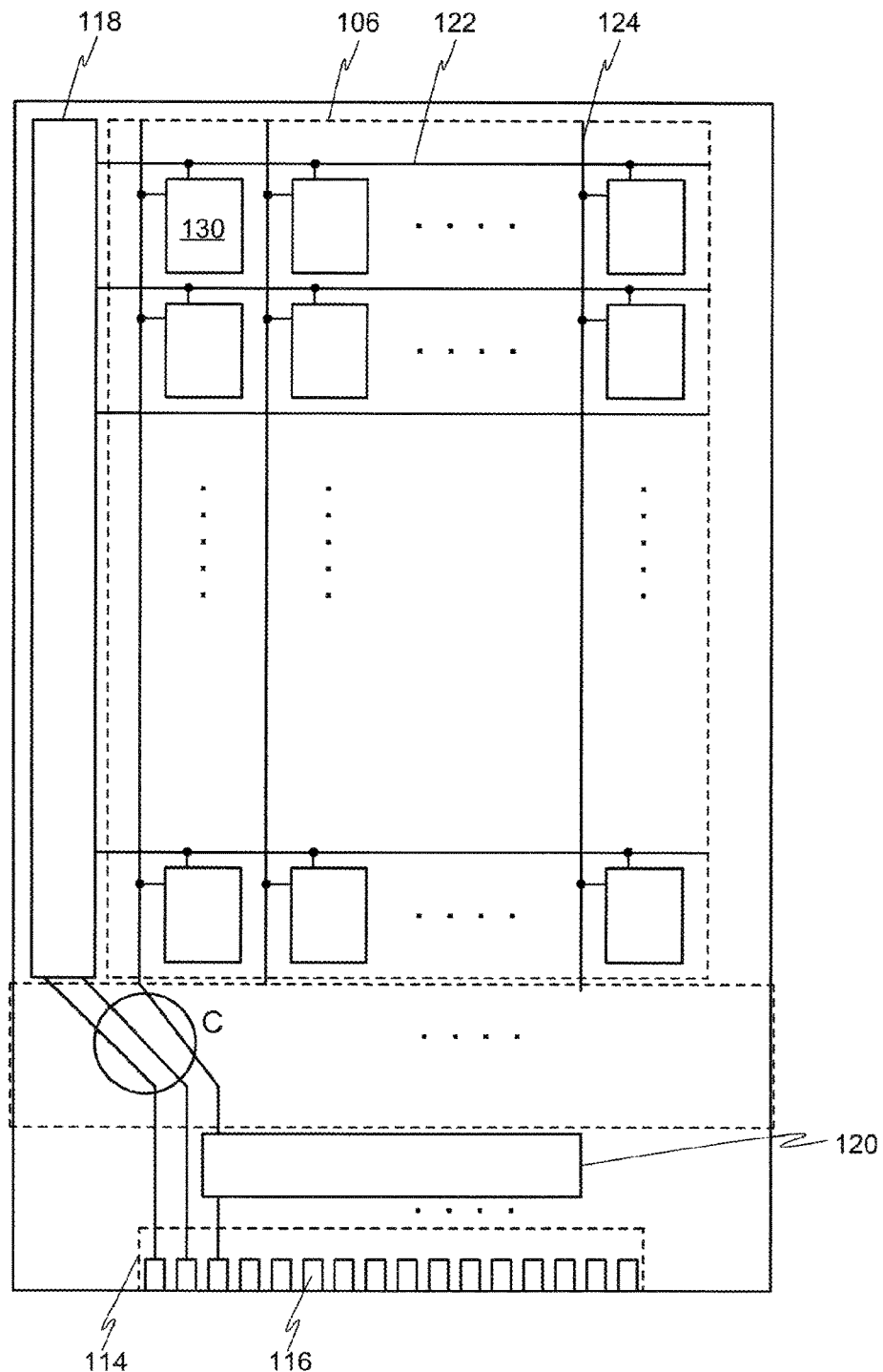
FIG. 3 is a circuit diagram illustrating the configuration of the display device according to the first embodiment of the present invention.

FIG. 3 is a plan view illustrating an example of the circuit configuration of the display device 100 according to the present embodiment. In the display device 100, signals for respectively driving the display device 100 from the plurality of connection terminals 116 are input to a scanning signal line driving circuit 118 and a video signal line driving circuit 120. The scanning signal line driving circuit 118 outputs a signal to the plurality of scanning signal lines 122, and the video signal line driving circuit 120 outputs a signal to the plurality of video signal lines 124. The plurality of scanning signal lines 122 and the plurality of video signal lines 124 respectively transmit the signals to the pixel circuits 130 arranged to correspond to the plurality of pixels 108.

The plurality of pixel circuits 130 are arranged in a row direction and a column direction. The number of arrays of the pixel circuits 130 is optional. For example, m pixel circuits 130 and n pixel circuits 130 are respectively arranged in the row direction and the column direction (m and n are integers). In the display region 102*a*, the plurality of scanning signal lines 122 extend in the row direction and are aligned in the column direction, and the plurality of video signal lines 124 extend in the column direction and are aligned in the row direction. A pixel array is not only a matrix array, like in this example, but also a PenTile array or a delta array.

Figure 4:
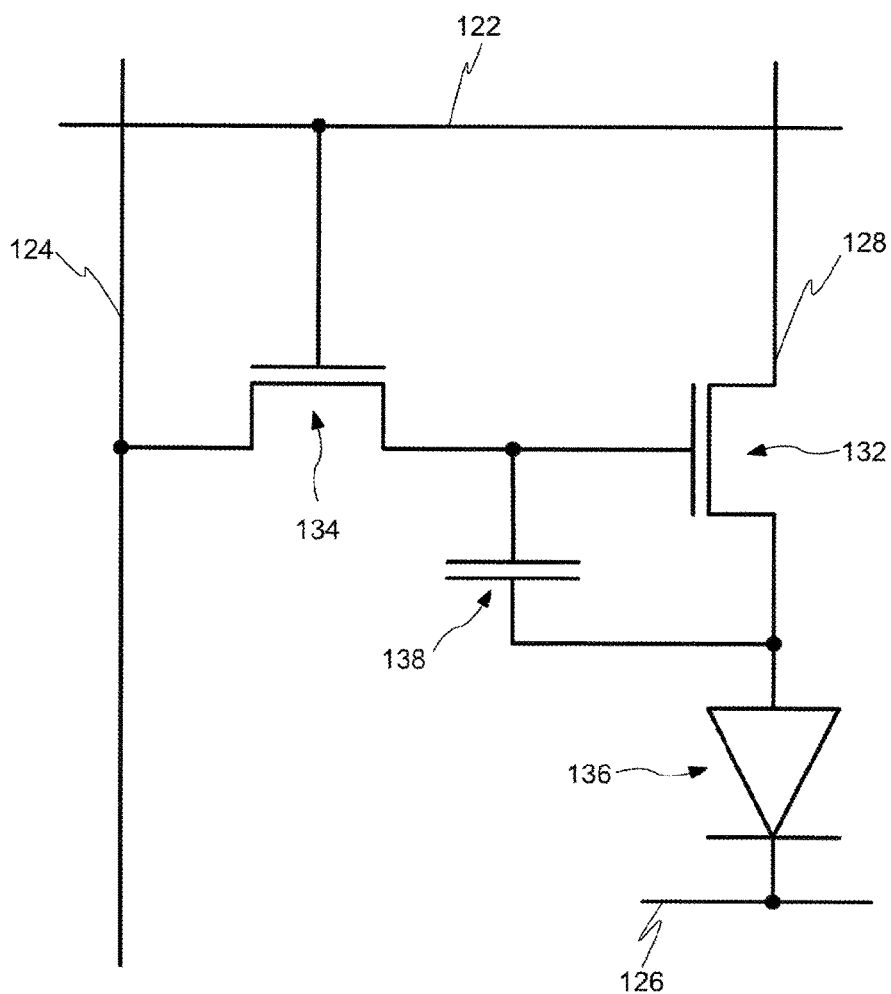
FIG. 4 is a circuit diagram illustrating a configuration of a pixel circuit included in the display device according to the first embodiment of the present invention.

FIG. 4 is a circuit diagram illustrating a configuration of the pixel circuit 130 included in the display device 100 according to the present embodiment. A circuit configuration of the pixel circuit 130 described below is an example, and is not limited to this.

Each of the plurality of pixel circuits 130 includes at least a driving transistor 132, a selection transistor 134, a light emitting element 136, and a capacitor 138.

The driving transistor 132 is a transistor which is connected to the light emitting element 136 and controls luminescent luminance of the light emitting element 136. A drain current is controlled by a gate-to-source voltage of the driving transistor 132. The driving transistor 132 has its gate connected to the drain of the selection transistor 134, its source connected to a driving power supply line 128, and its drain connected to the anode of the light emitting element 136.

The selection transistor 134 is a transistor which controls a conductive state between the video signal line 124 and the gate of the driving transistor 132 by an on/off operation. The selection transistor 134 has its gate connected to the scanning signal line 122, its source connected to the video signal line 124, and its drain connected to the gate of the driving transistor 132.

The light emitting element 136 is a self-light emitting element which emits light having a luminance corresponding to a current flowing between the source and the drain of the driving transistor 132. The light emitting element 136 includes the anode connected to the drain of the driving transistor 132 and a cathode connected to a reference potential line 126.

The capacitor 138 is connected between the gate and the drain of the driving transistor 132. The capacitor 138 retains the gate-to-drain voltage of the driving transistor 132.

The circuit configuration of the display device 100 according to the present embodiment and the circuit configuration of the pixel circuit 130 included in each of the plurality of pixels 108 have been described above. The detailed configuration of the display device 100 according to the present embodiment will be described below.

[Cross-sectional Configuration]

Figure 5:
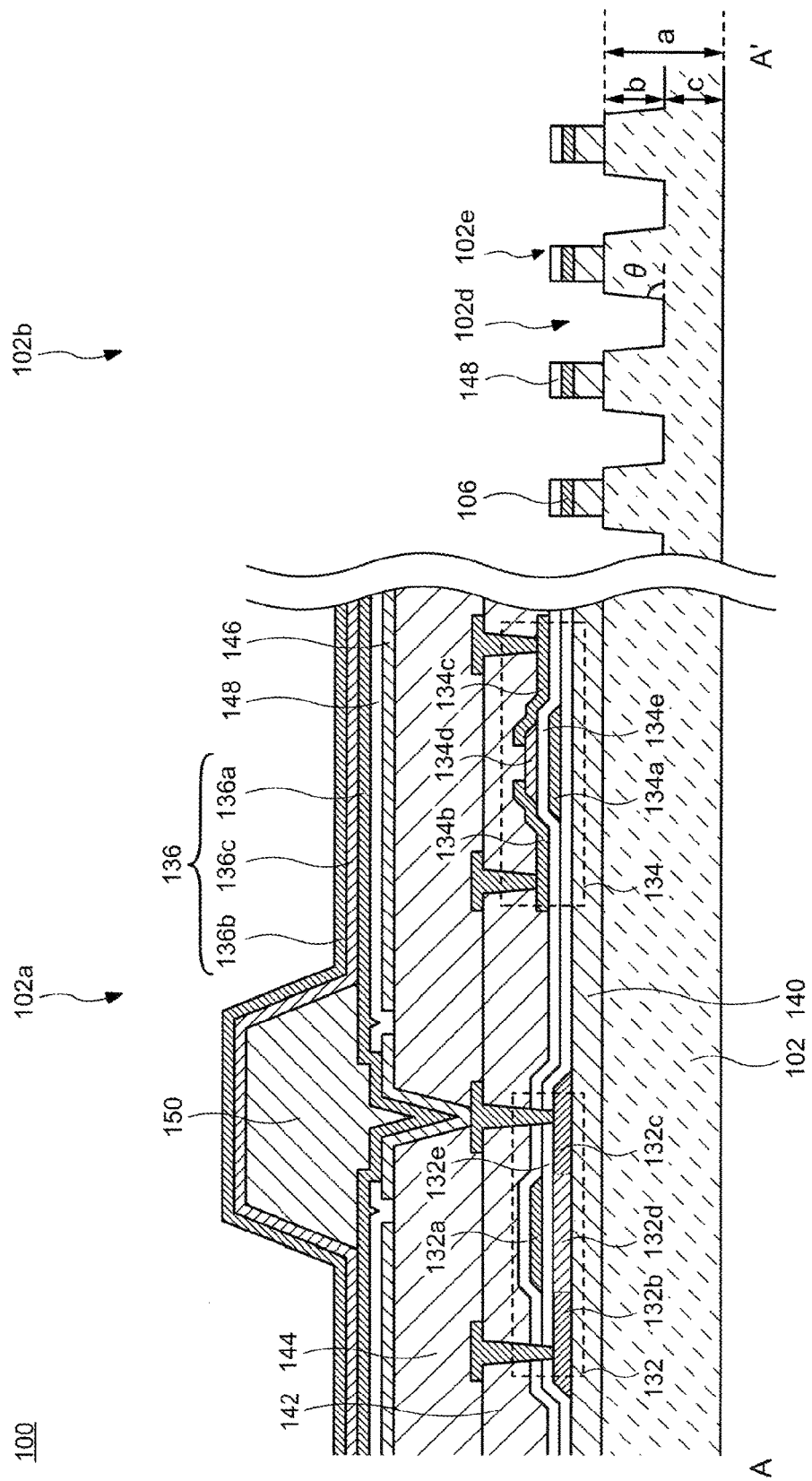
FIG. 5 is a cross-sectional view illustrating the configuration of the display device according to the first embodiment of the present invention.

FIG. 5 is a cross-sectional view illustrating the configuration of the display device 100 according to the present embodiment. FIG. 5 illustrates a cross section taken along a line A-A' illustrated in FIG. 1.

The display device 100 according to the present embodiment includes the first substrate 102, the plurality of wirings 106, and a first insulating layer 140.

The first substrate 102 has flexibility. The display region 102*a* and the bending region 102*b* are arranged in the first substrate 102. An example of a material usable for the first substrate 102 has been described when the configuration of the appearance has been described.

The display region 102*a* in the first substrate 102 is a region where the plurality of pixels 108 are arranged. Each of the plurality of pixels 108 includes at least the driving transistor 132, the selection transistor 134, the light emitting element 136, and the capacitor 138 (not illustrated in FIG. 5). While the driving transistor 132 and the selection transistor 134 are described as respectively having different configurations in the present embodiment, transistors having the same configuration may be respectively arranged in the driving transistor 132 and the selection transistor 134. The driving transistor 132 may be arranged on the side closer to a bank 150 than the selection transistor 134, as viewed from a central portion of each of the pixels 108.

The driving transistor 132 is arranged in a layer above the first insulating layer 140. The drain of the driving transistor 132 is connected to the anode of the light emitting element 136.

In the present embodiment, the driving transistor 132 has a so-called top gate structure in which the gate thereof is arranged on a layer above a semiconductor layer 132*d* with a gate insulating layer interposed therebetween. In the present embodiment, the semiconductor layer 132*d* in the driving transistor 132 is composed of polycrystalline silicon (polysilicon).

A gate insulating layer (hereinafter referred to as "first gate insulating layer 132*e*") in the driving transistor 132 is arranged in a layer above the semiconductor layer 132*d* in the driving transistor 132 and below the selection transistor 134 for a cross-sectional structure. The first gate insulating layer 132*e* is arranged over the display region 102*a* for a planar structure. That is, the first gate insulating layer 132*e* does not extend to the bending region 102*b*.

As a material for the first gate insulating layer 132*e*, an inorganic insulating material can be used. Examples of the inorganic insulating material can include silicon oxide or silicon nitride. Alternatively, a stacked structure with a combination of the inorganic insulating materials may be used.

The selection transistor 134 is arranged in a layer above the first gate insulating layer 132*e*. The selection transistor 134 has a so-called bottom gate structure in which the gate thereof is arranged in a layer below a semiconductor layer 134*d* with a gate insulating layer interposed therebetween. In the present embodiment, the semiconductor layer 134*d* in the selection transistor 134 is composed of an oxide semiconductor.

A gate insulating layer (hereinafter referred to as "second gate insulating layer 134*e*") in the selection transistor 134 is arranged in a layer above a gate 134*a* of the selection transistor 134 and above the gate 132*a* of the driving transistor 132 for a cross-sectional structure. The second gate insulating layer 134e is arranged over the display region 102a for a planar structure. That is, the second gate insulating layer 134e does not extend to the bending region 102b.

The light emitting element 136 is provided on a flattening insulating layer 144. The flattening insulating layer 144 is provided on a second insulating layer 142. The second insulating layer 142 is provided to cover the driving transistor 132 and the selection transistor 134.

As a material for the second insulating layer 142, an inorganic insulating material can be used. Examples of the inorganic insulating material can include silicon oxide or silicon nitride. Alternatively, a stacked structure with a combination of the inorganic insulating materials may be used.

The flattening insulating layer 144 is provided to flatten unevenness caused by various types of transistors and wirings arranged in a layer therebelow. As a material for the flattening insulating layer 144, an organic insulating material can be used. Examples of the organic insulating material can include acrylic resin or polyimide resin.

The light emitting element 136 is a self-luminescent light emitting element. Examples of the self-luminescent light emission element can include an organic EL light emitting element. The organic EL light emitting element includes a pixel electrode 136a, a common electrode 136b, and a light emitting layer 136c.

The pixel electrode 136a is arranged for each of the plurality of pixels 108. A material for the pixel electrode 136a preferably includes a metal layer having a high reflectivity to reflect light emitted by the light emitting layer 136c toward the common electrode 136b. Examples of the metal layer having a high reflectivity can include silver (Ag) or an alloy containing silver.

Furthermore, a transparent conductive layer may be stacked in addition to the above-described metal layer having a high reflectivity. Examples of the transparent conductive layer preferably include indium tin oxide (tin oxide-added indium oxide) (ITO) or indium zinc oxide (indium oxide and zinc oxide) (IZO). Any combination of materials, described above, may be used.

The common electrode 136b is arranged over the plurality of pixels 108. As a material for the common electrode 136b, a material having a translucent property to transmit light emitted by the light emitting layer 136c and having a conductive property is preferably used. Examples of the common electrode 136b preferably include ITO or IZO. Alternatively, as the common electrode 136b, a metal layer having a film thickness enough to transmit emitted light may be used. The common electrode 136b may be divided into a plurality of sections if the same voltage is applied in an entire pixel region or may be provided for each of the pixels 108.

The light emitting layer 136c is arranged while being sandwiched between the pixel electrode 136a and the common electrode 136b. A material for the light emitting layer 136c is an organic EL material which emits light when a current is supplied thereto. As an organic EL material, a low-molecular or high-molecular organic material can be used. If the low-molecular organic material is used, the light emitting layer 136c includes not only a luminescent organic material but also a hole injection layer and an electron injection layer and further a hole transport layer and an electronic transport layer to sandwich the luminescent organic material.

In the present embodiment, a transparent conductive layer 146 and a third insulating layer 148 are arranged from below between the flattening insulating layer 144 and the pixel electrode 136a. The transparent conductive layer 146, the third insulating layer 148, and the pixel electrode 136a can form a capacitor.

The bank 150 is provided between the two adjacent pixels 108. The bank 150 is provided to cover a peripheral edge of the pixel electrode 136a. Further, the bank 150 is provided to cover a connection portion between a drain 132c of the driving transistor 132 and the pixel electrode 136a.

As a material for the bank 150, an insulating material is preferably used. As the insulating material, an inorganic insulating material or an organic insulating material can be used. Examples of the inorganic insulating material can include silicon oxide, silicon nitride, or their combination. Examples of the organic insulating material can include polyimide resin, acrylic resin, or their combination. A combination of the inorganic insulating material and the organic insulating material may be used.

When the bank 150 formed of an insulating material is arranged, the common electrode 136b and the pixel electrode 136a can be prevented from being shorted at an end of the pixel electrode 136a. Further, the adjacent pixels 108 can be reliably insulated from each other.

The bending region 102b is provided on a part of a surface, on which the plurality of pixels 108 are arranged, of the first substrate 102 or a surface opposite to the surface, on which the plurality of pixels 108 are arranged, of the first surface 102. The bending region 102b in the first substrate 102 has an uneven pattern on at least its one surface. The uneven pattern (unevenness may be formed on a surface on the side of an observer of the first substrate 102 or a surface opposite to the side of the observer) has regions respectively having different thicknesses alternately arranged therein in the first substrate 102. The uneven pattern is formed by a plurality of recess portions 102d being formed for the first substrate 102. A region, excluding the recess portion 102d, in the bending region 102b is hereinafter referred to as a convex portion 102e. The recess portions 102d in the bending region 102b are respectively formed among the plurality of wirings 106 arranged in the bending region 102b. The convex portion 102e in the uneven pattern may have a tapered shape.

The first substrate 102 has the aforementioned uneven pattern in the bending region 102b, resulting in improved flexibility in the bending region 102b. Thus, when the bending region 102b is folded, a crack can be inhibited from occurring in a folded site.

An optimum shape of the uneven pattern will be described below. First, a, b, and c (=a−b) are respectively the thickness of the first substrate 102, the depth of the recess portion 102d, and the thickness of the recess portion 102d, as illustrated in FIG. 5. θ is a taper angle of the convex portion 102e.

The thickness a of the first substrate 102 is preferably not less than 10 μm nor more than 100 μm. At this time, the depth b of the recess portion 102d is preferably not less than 5 μm nor more than 95 μm and satisfies a>b. Further, at this time, the thickness of the recess portion 102d is preferably set to at least 5 μm.

The thickness a of the first substrate 102 is further preferably not less than 10 μm nor more than 30 μm. At this time, the depth b of the recess portion 102d is preferably not less than 10 μm nor more than 20 μm and satisfies a>b.

A ratio b/a of the thickness a of the first substrate 102 to the depth b of the recess portion 102d is preferably not less than 0.5 nor more than 0.95. When the ratio is lower, higher flexibility can be obtained.

The taper angle θ is preferably not less than 45° nor more than 90°. When the taper angle θ is in this range, an effect of the uneven pattern is increased so that the flexibility of the bending region 102b can be greatly improved.

The plurality of wirings 106 each transmit a signal for driving the plurality of pixels 108. The plurality of wirings 106 are respectively arranged on the convex portions 102e in the uneven pattern in the bending region 102b.

The plurality of wirings 106 may be respectively arranged in partial regions on the convex portions 102e in the uneven pattern. In other words, the recess portions 102d in the uneven pattern may be respectively arranged in partial regions among the plurality of wirings 106.

The first insulating layer 140 is arranged on the side of one surface of the first substrate 102. In the display region 102a, the first insulating layer 140 is arranged over the plurality of pixels 108. On the other hand, in the bending region 102b, the first insulating layer 140 is arranged on the convex portions 102e in the uneven pattern. That is, the first insulating layer 140 is arranged among the plurality of wirings 106 and the convex portions 102e in the uneven pattern.

As a material for the first insulating layer 140, an inorganic insulating material can be used. Examples of the inorganic insulating material can include silicon oxide and silicon nitride. Alternatively, a stacked structure with a combination of the inorganic insulating materials may be used. Thus, in the display region 102a, water can be inhibited from entering the pixels 108 from the side of a rear surface of the first substrate 102, and impurities can be inhibited from being diffused into the pixels 108 from inside the first substrate 102. Thus, the pixels 108 can be inhibited from deteriorating.

[Planar Configuration of Wirings]

A planar configuration of the wirings 106 included in the display device 100 according to the present embodiment will be described. FIGS. 6A to 6D are plan views each illustrating an example of the planar configuration of the wirings 106 included in the display device 100 according to the present embodiment. In FIGS. 6A to 6D, examples of the planar configuration of the wirings 106 in a region C illustrated in FIG. 3.

Figure 6A:
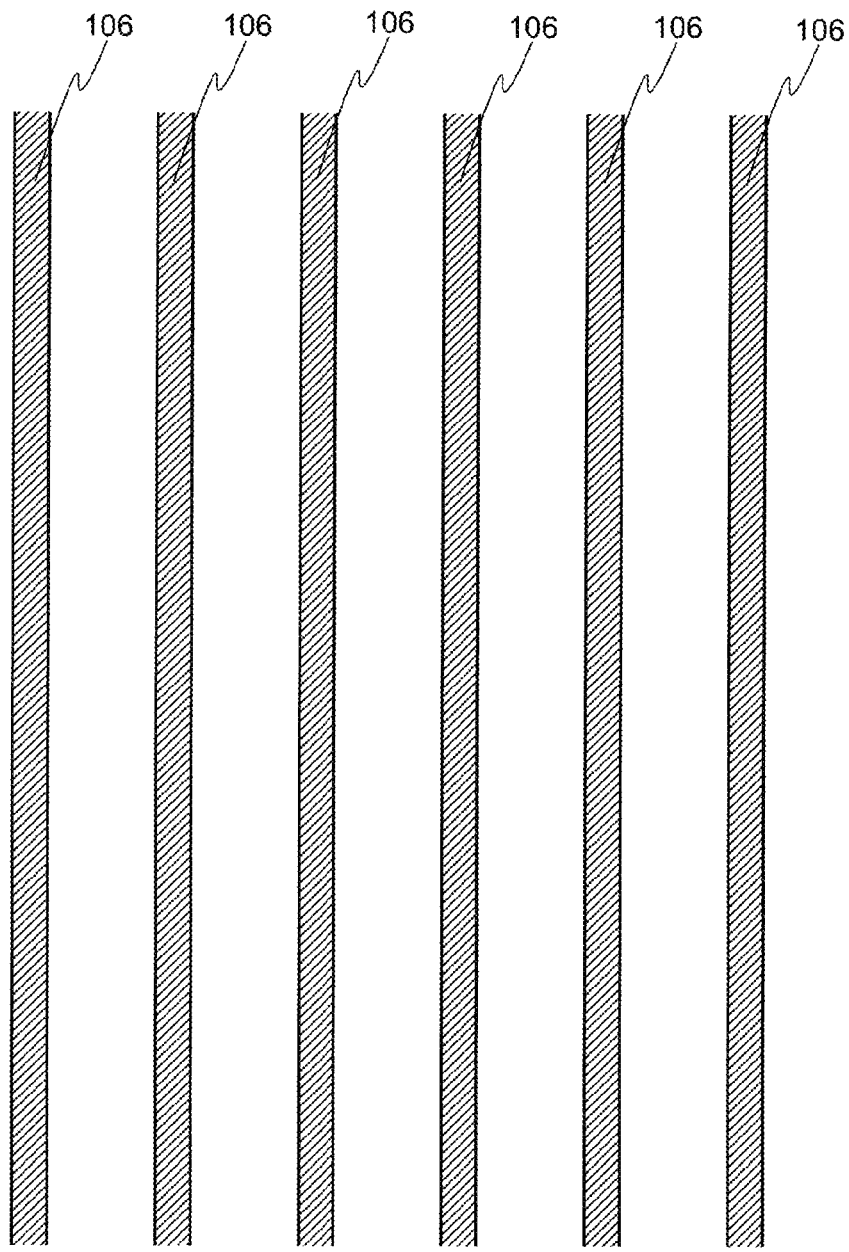
FIG. 6A is a plan view illustrating a planar configuration of wirings included in the display device according to the first embodiment of the present invention.

FIG. 6A illustrates an example of the planar configuration of the plurality of wirings 106 in the bending region 102b. In this example, the plurality of wirings 106 extend in a linear shape.

Figure 6B:
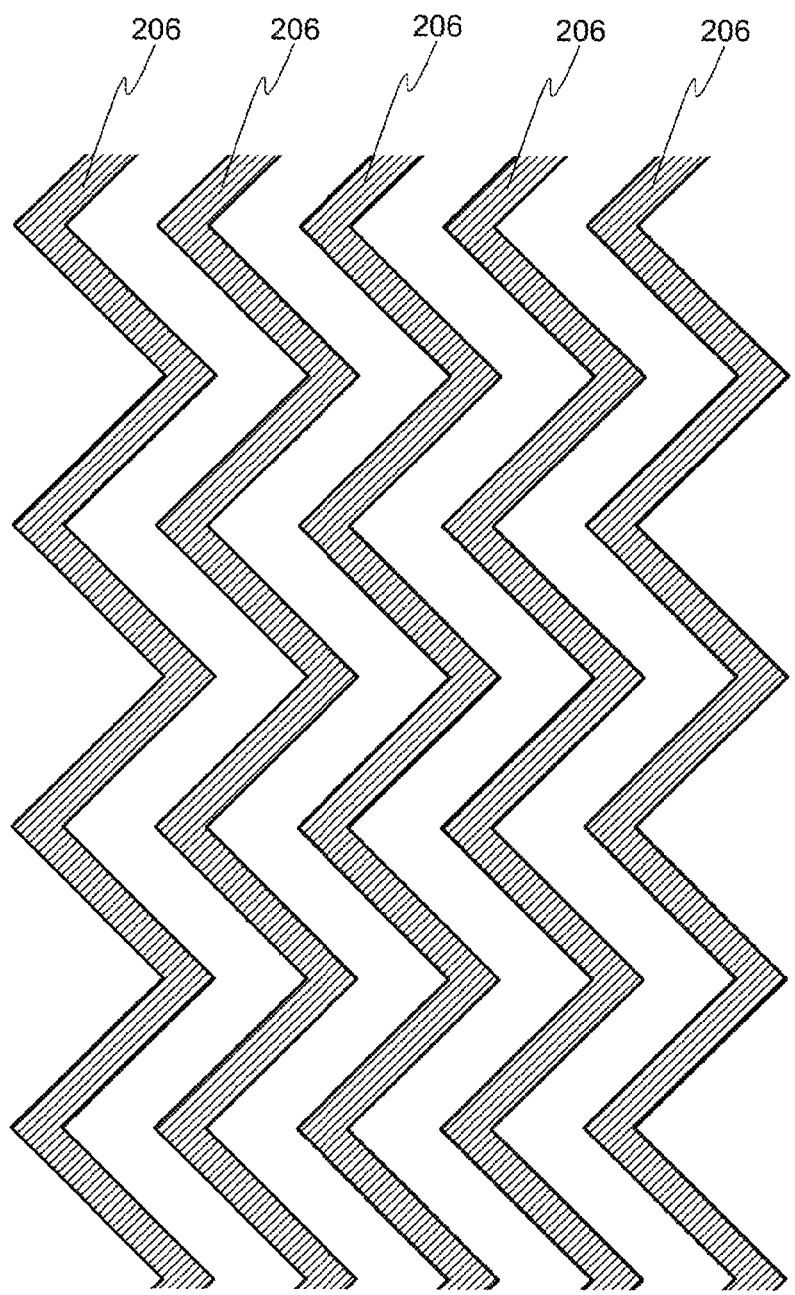
FIG. 6B is a plan view illustrating a planar configuration of wirings included in the display device according to the first embodiment of the present invention.

FIG. 6B illustrates another example of a planar configuration of a plurality of wirings 206 in the bending region 102b. In this example, each of the plurality of wirings 206 is arranged while bending in a planar view in the bending region 102b. Further, each of the plurality of wirings 206 is arranged while repeatedly periodically bending. When the plurality of wirings 206 are thus configured, the flexibility of the wirings 206 in the bending region 102b is improved.

Figure 6C:
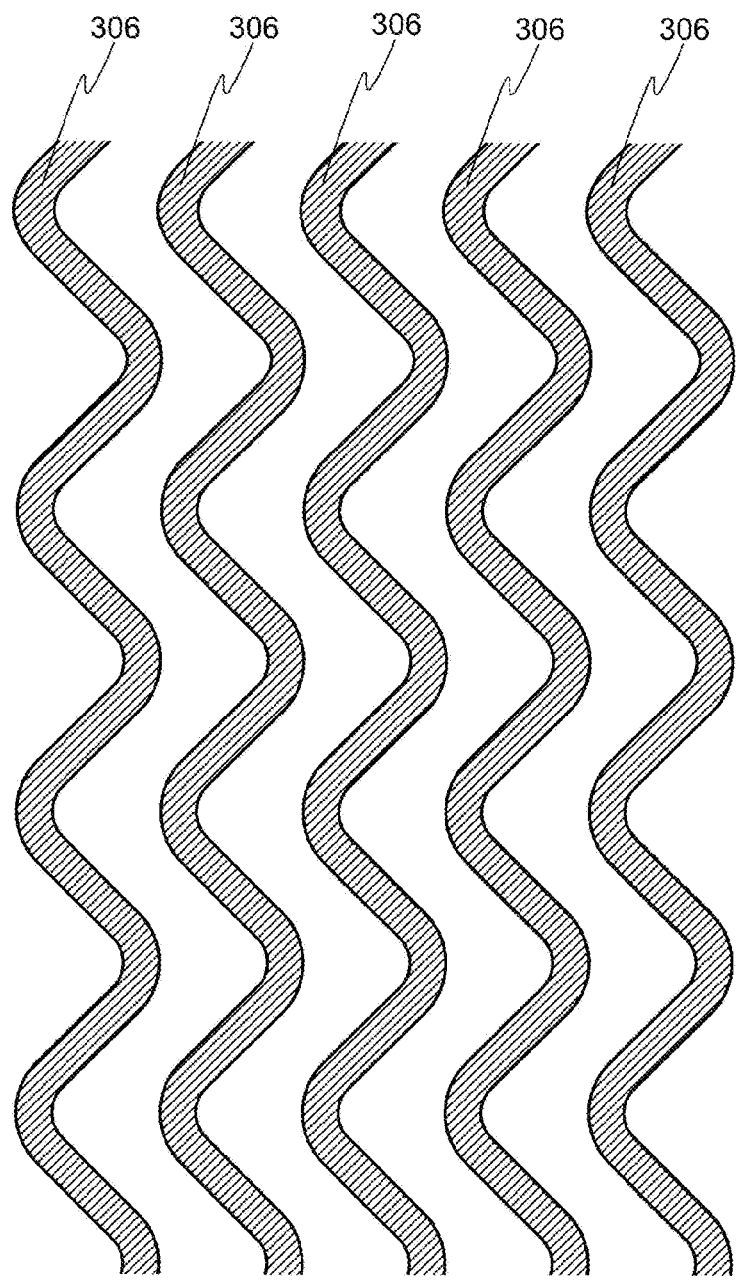
FIG. 6C is a plan view illustrating a planar configuration of wirings included in the display device according to the first embodiment of the present invention.

FIG. 6C illustrates another example of a planar configuration of a plurality of wirings 306 in the bending region 102b. In this example, each of the plurality of wirings 306 is arranged while meandering in a planar view in the bending region 102b. Further, each of the plurality of wirings 306 is arranged while repeatedly periodically meandering. When the plurality of wirings 306 are thus configured, the flexibility of the wirings 306 in the bending region 102b is improved.

Figure 6D:
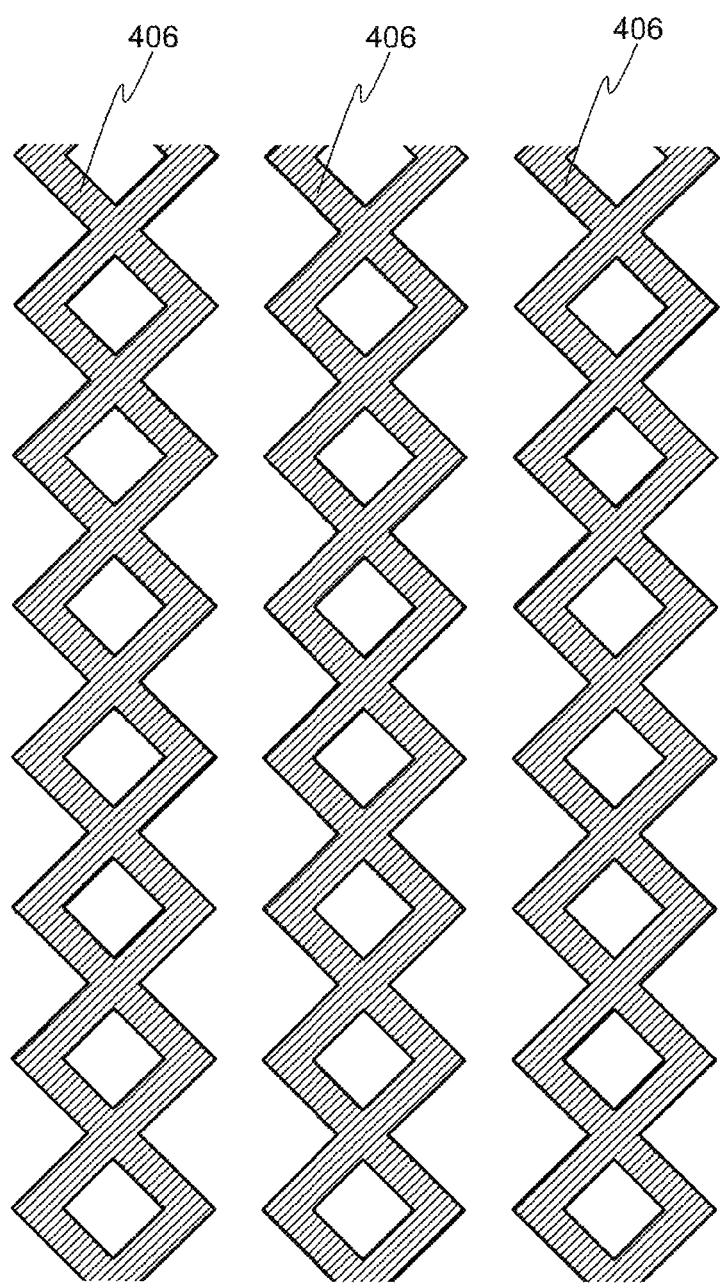
FIG. 6D is a plan view illustrating a planar configuration of wirings included in the display device according to the first embodiment of the present invention.

FIG. 6D illustrates another example of a planar configuration of a plurality of wirings 406 in the bending region 102b. In this example, each of the plurality of wirings 406 includes the two wirings which is arranged while bending in the bending region 102b and are arranged while intersecting each other. Further, each of the plurality of wirings 406 includes regions arranged while repeatedly periodically intersecting. Each of the plurality of wirings 406 can also be said to have a plurality of openings periodically arranged in the bending region 102b. When the plurality of wirings 406 are thus configured, the flexibility of the plurality of wirings 406 in the bending region 102b is improved.

A specific configuration of the display device 100 according to the present embodiment has been described above. A method of manufacturing the display device 100 according to the present embodiment will be described below.

[Manufacturing Method]

FIGS. 7A to 7J are cross-sectional views each illustrating a method of manufacturing the display device 100 according to the present embodiment. FIGS. 7A to 7J each illustrates a cross section taken along a line A-A' illustrated in FIG. 1.

First, a resin layer is applied onto and formed on a support substrate. Examples of the support substrate can include a glass substrate and a metal substrate. The film thickness of the resin layer is approximately not less than 5 μm nor more than 100 μm, and preferably not less than 10 μm nor more than 30 μm. The formed resin layer becomes a first substrate 102 having flexibility. In the first substrate 102, a display region 102a and a bending region 102b are arranged. The display region 102a is a region having a plurality of pixels 108 arranged on its first surface.

Figure 7A:
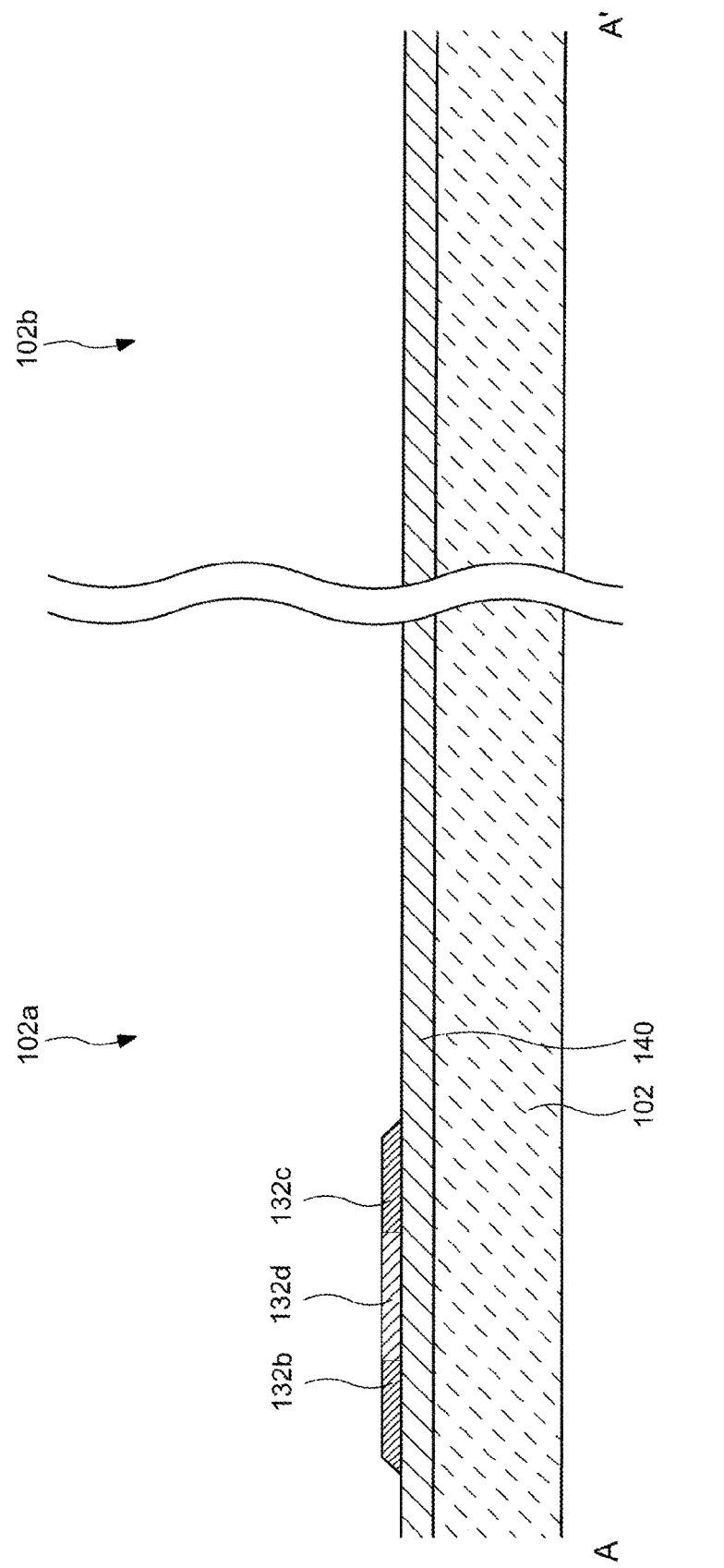
FIG. 7A is a cross-sectional view illustrating a method of manufacturing the display device according to the first embodiment of the present invention.

Then, a first insulating layer 140 is formed on a first surface of the first substrate 102, a polysilicon layer is film-formed and patterned thereon, and a polysilicon layer to be a semiconductor layer 132d in a driving transistor 132 is formed (FIG. 7A).

As a material for the first insulating layer 140, an inorganic insulating material can be used. Examples of the inorganic insulating material can include silicon oxide and silicon nitride. Alternatively, a stacked structure with a combination of the inorganic insulating materials can be used. As a film formation method, a chemical vapor deposition (CVD) method, for example, can be used.

An amorphous silicon layer is first formed using a CVD method, followed by polycrystallization using heat treatment and an Excimer Laser Anneal (ELA) method, to form the polysilicon layer.

Then, the polysilicon layer is patterned using a photolithography process, to form an island-shaped polysilicon layer.

Then, a required number of times of ion implantation processing is performed for the island-shaped polysilicon layer. Impurities such as phosphorus (P) are implanted to form an n-type region, and impurities such as boron (B) are implanted to form a p-type region. In FIGS. 7A to 7J, the semiconductor layer 132d in the driving transistor 132 is illustrated, impurities such as phosphorus (P) are implanted at a high concentration into the polysilicon layer, to give an n-type conductive property to regions respectively serving as a source and a drain.

While an example in which the patterning of the polysilicon layer is followed by the ion implantation in the foregoing processes, the order of the processes is not limited to this, and may be reversed.

Then, a gate insulating layer (a first gate insulating layer 132e) in the driving transistor 132 is formed, and a gate 132a of the driving transistor 132 and a gate 134a of a selection transistor 134 are simultaneously formed thereon (FIG. 7B).

As the first gate insulating layer 132e, an inorganic insulating material can be used. Examples of the inorganic insulating material can include silicon oxide, silicon nitride, or the like. As a film formation method, a CVD method, for example, can be used.

In a process for forming the gate 132a of the driving transistor 132 and the gate 134a of the selection transistor 134, a first metal layer is film-formed and patterned. Examples of the first metal layer can include tungsten (W), molybdenum-tungsten (MoW), molybdenum/aluminum/molybdenum (Mo/Al/Mo), titanium/aluminum/titanium (Ti/Al/Ti), or the like. As a film formation method, a sputtering method, for example, can be used.

Then, the first metal layer is patterned using a photolithography process. As an etching method, dry etching or wet etching can be used. By this process, the gate 132a of the driving transistor 132 and the gate 134a of the selection transistor 134 are formed.

Figure 7C:
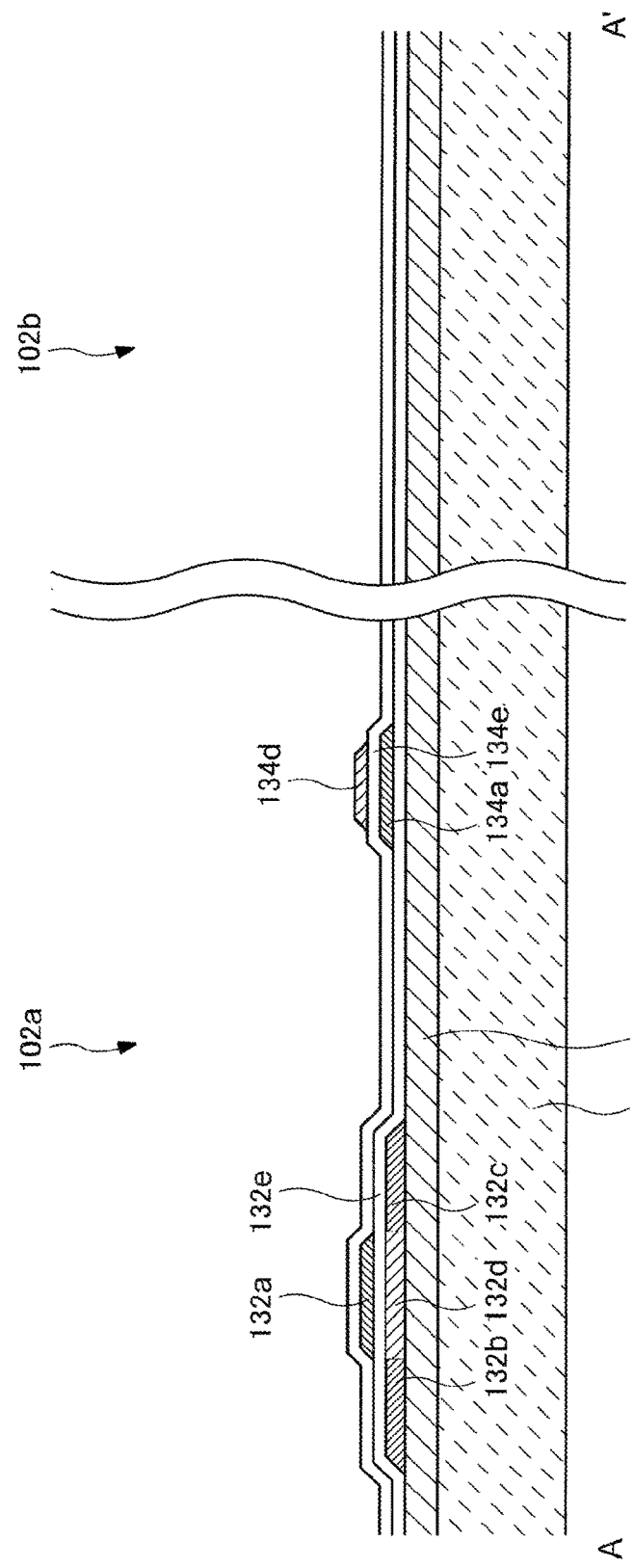
FIG. 7C is a cross-sectional view illustrating a method of manufacturing the display device according to the first embodiment of the present invention.

Then, a gate insulating layer (a second gate insulating layer 134e) in the selection transistor 134 is formed, and an oxide semiconductor layer serving as a semiconductor layer 134d in the selection transistor 134 is formed thereon (FIG. 7C).

For the second gate insulating layer 134e, a similar material and a similar film formation method to those for the aforementioned first gate insulating layer 132e can be used.

As a film formation method for the oxide semiconductor layer, a sputtering method can be used. In film formation using the sputtering method, substrate heating is performed at the time of film formation, mixed gas argon (Ar)/O$_2$ is used, and a gas ratio satisfies Ar<O$_2$. As a power supply for sputtering, a direct current (DC) power supply or a radio frequency (RF) power supply may be used. The power supply for sputtering can be determined to match a formation condition of a sputtering target. If the sputtering target is indium gallium zinc oxide (InGaZnO), for example, a composition ratio can be determined for any purpose (e.g., a transistor characteristic), for example, In:Ga:Zn:O=1:1:1:4 (indium trioxide (In$_2$O$_3$):gallium trioxide (Ga$_2$O$_3$):zinc oxide (ZnO)=1:1:2).

Annealing processing may be performed to achieve improvements in film quality such as dehydrogenation from the oxide semiconductor layer 174 and an improvement in density. Annealing conditions such as an atmosphere (any one of vacuum, nitrogen, dry air, and atmospheric air), a temperature (250 to 500° C.), a time period (15 min to 1 h) may be determined depending on contents of the aimed improvements in film quality.

Then, the oxide semiconductor layer is patterned using a photolithography process. Thus, the semiconductor layer 134d in the selection transistor 134 is formed.

While an example in which the annealing is performed before the oxide semiconductor layer is patterned has been illustrated in the present embodiment, the present invention is not limited to this. The annealing may be performed either before or after the patterning. If the temperature is high, annealing is preferably performed before the patterning to suppress a pattern shift by shrink of the oxide semiconductor layer 174.

Then, a source 134b and a drain 134c of the selection transistor 134 are formed (FIG. 7D). In this process, a second metal layer is film-formed and patterned. Examples of the second metal layer can include W, MoW, Mo/Al/Mo, Ti/Al/Ti, or the like. As a film formation method, a sputtering method, for example, can be used.

Then, the second metal layer is patterned using a photolithography process. As an etching method, dry etching or wet etching can be used. By this process, the source 134b and the drain 134c of the selection transistor 134 are formed.

Then, a second insulating layer 142 is formed, to perform desired patterning (FIG. 7E). As a material for the second insulating layer 142, an inorganic insulating material can be used. Examples of the inorganic insulating material can include silicon oxide, silicon nitride, or the like. As a film formation method, a CVD method, for example, can be used.

By the patterning for the second insulating layer 142, a plurality of contact holes are formed in the second insulating layer 142 while a first gate insulating layer 132e, a second gate insulating layer 134e, and a second insulating layer 142 in the bending region 102b are removed by a photolithography process. Specifically for formation of the plurality of contact holes, the contact hole reaching the source 132b and the drain 132c of the driving transistor 132 and the contact hole reaching the source 134b and the drain 134c of the selection transistor 134 are simultaneously formed.

Then, a video signal line 124 and a reference potential line 126 are formed while a wiring 106 is formed on the second insulating layer 142 (FIG. 7F). The wiring 106 is a wiring which transmits a signal for driving the plurality of pixels 108. In this process, a third metal layer is film-formed and patterned. Examples of the third metal layer can include W, MoW, Mo/Al/Mo, Ti/Al/Ti, or the like. As a film formation method, a sputtering method, for example, can be used.

Then, the third metal layer is patterned using a photolithography process. As an etching method, dry etching or wet etching can be used. By this process, the video signal line 124 and the reference potential line 126 are formed while a plurality of wirings 106 are formed.

Then, a flattening insulating layer 144 is film-formed on the aforementioned various types of wirings, and a desired contact opening is formed while the flattening insulating layer 144 in the bending region 102b is removed (FIG. 7G).

The flattening insulating layer 144 is provided to flatten unevenness caused by various types of transistors and wirings arranged in layers therebelow. As a material for the flattening insulating layer 144, an organic insulating material can be used. Examples of the organic insulating material can include acrylic resin and polyimide resin. As a film formation method, an application method, for example, can be used.

Then, a transparent conductive layer 146 is film-formed and patterned on the flattening insulating layer 144 (FIG. 7H). When the transparent conductive layer 146 is patterned, the transparent conductive layer 146 in the bending region 102b is removed. Examples of a material for the transparent conductive layer 146 can include ITO and IZO, their stack, or the like.

Then, a third insulating layer 148 is film-formed and patterned (FIG. 7I). As the third insulating layer 148, an inorganic insulating material can be used. Examples of the inorganic insulating material can include silicon oxide and silicon nitride. As a film formation method, a CVD method, for example, can be used. The third insulating layer 148 is patterned to be left on the wiring 106 in the bending region 102b.

Figure 7J:
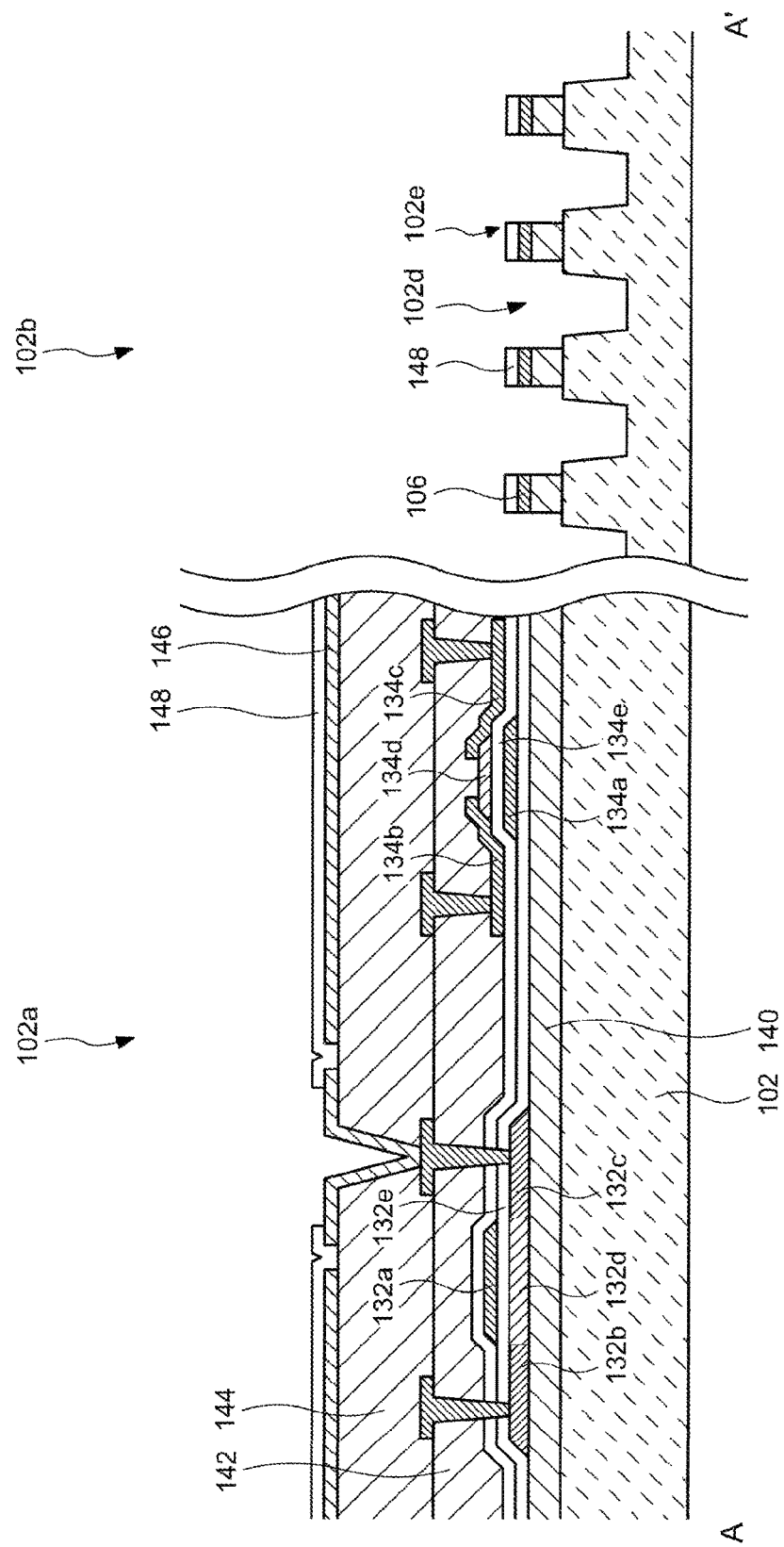
FIG. 7J is a cross-sectional view illustrating a method of manufacturing the display device according to the first embodiment of the present invention.

Then, an uneven pattern is formed in the bending region 102b in the first substrate 102 (FIG. 7J). In this process, recess portions 102d are respectively formed among the plurality of wirings 106 using a photolithography process. In the present embodiment, areas among the plurality of wirings 106 are etched from the side of a first surface of the first substrate 102 in the bending region 102b. At this time, the first insulating layer 140 and the first substrate 102 are collectively etched so that the recess portions 102d in the first substrate 102 have a desired depth.

In this process, the display region 102a and regions to be the convex portions 102e in the bending region 102b are protected by photoresist not to be etched.

Then, a light emitting element 136 is formed on the second insulating layer 142, to complete an array substrate illustrated in FIG. 5. Formation of a pixel electrode 136a, formation of a bank 150, formation of a light emitting layer 136c, and formation of a common electrode 136b are included in this order in the formation of the light emitting element 136.

A material for the pixel electrode 136a preferably includes a metal layer having a high reflectivity such as Ag. Further, a transparent conductive layer such as ITO or IZO may be stacked. As a film formation method, a sputtering method can be used.

The bank 150 is formed between the two adjacent pixels 108. The bank 150 is provided to cover a peripheral edge of the pixel electrode 136a. As a material for the bank 150, an insulating material is preferably used. As the insulating material, an inorganic insulating material or an organic insulating material can be used, as described above.

The light emitting layer 136c is formed to cover the pixel electrode 136a and the bank 150. As a film formation method for the light emitting layer 136c, an evaporation method can be used.

The common electrode 136b is formed to cover the plurality of pixels 108 in the display region 102a. Examples of a material for the common electrode 136b preferably include ITO, IZO, or the like. Alternatively, as the common electrode 136b, a metal layer having a film thickness enough to transmit emitted light may be used. As a film formation method for the common electrode 136b, a sputtering method can be used.

The configuration of the display device 100 according to the present embodiment and the method of manufacturing the same have been described above. The configuration of the display device 100 according to the present embodiment enables an improvement in reliability because the first substrate 102 is not easily cracked when folded.

An example in which the third insulating layer 148 is used as an insulating layer for protecting the wirings 106 in the display device 100 according to the present embodiment has been described. However, an insulating layer for protecting the wirings 106 is not limited to this. An insulating layer film-formed after a process for forming the wirings 106 can be used as an insulating layer for protecting the wirings 106. As another example, the flattening insulating layer 144 may be used as an insulating layer for protecting the wirings 106.

An example in which the uneven pattern is formed after the third insulating layer 148 is formed in the method of manufacturing the display device 100 according to the present embodiment has been described. However, a process for forming the uneven pattern is not limited to this. As another example, an uneven pattern may be formed in the first substrate 102 before the wirings 106 are formed. As another example, an uneven pattern may be formed in the first substrate 102 after the bank 150 is formed.

<Second Embodiment>

Figure 8:
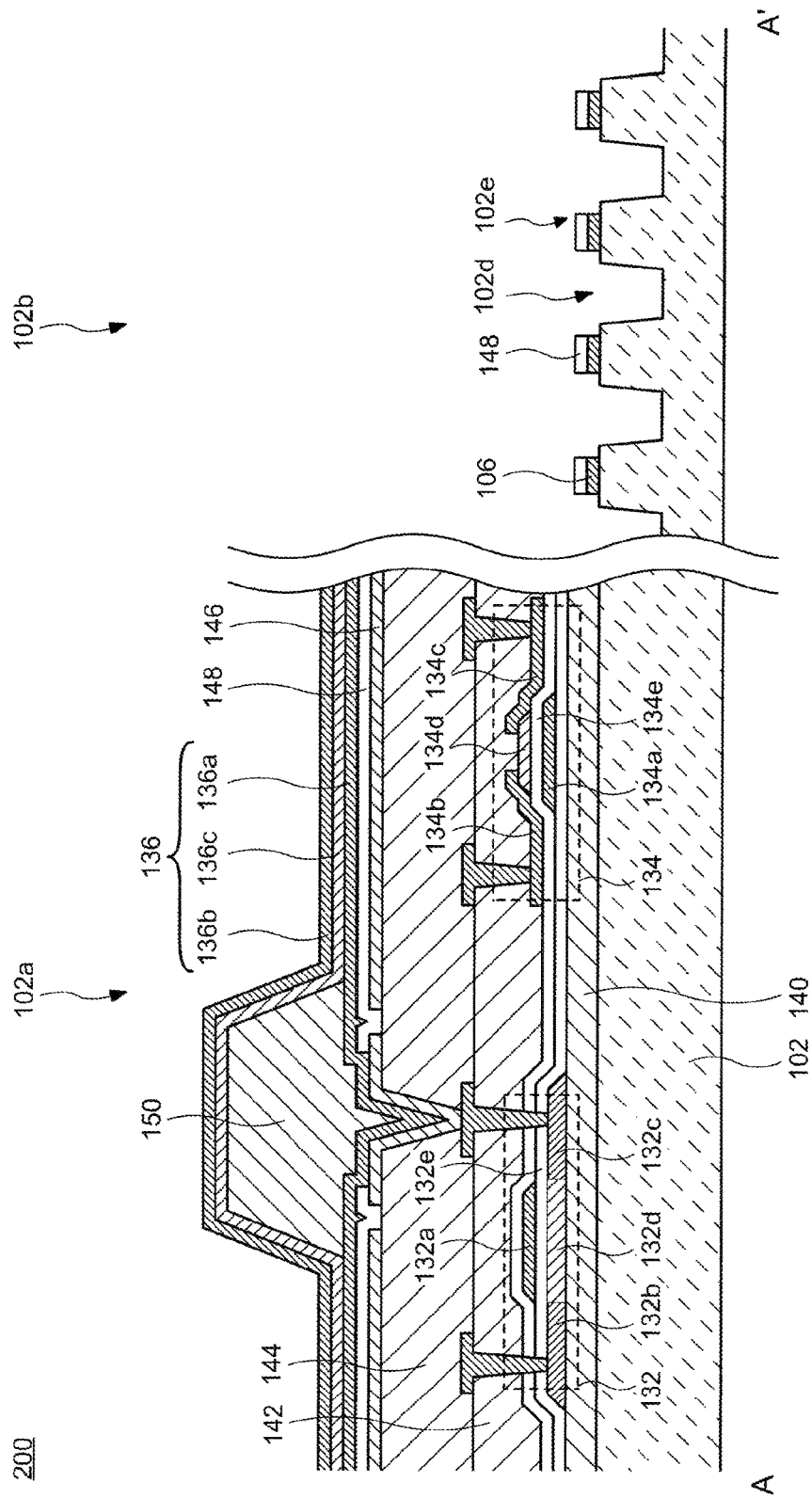
FIG. 8 is a cross-sectional view illustrating a configuration of a display device according to a second embodiment of the present invention.

A configuration of a display device 200 according to the present embodiment will be described with reference to FIG. 8. FIG. 8 is a cross-sectional view illustrating the configuration of the display device 200 according to the present embodiment. A difference between the display device 200 according to the present embodiment and the display device 100 according to the first embodiment will be specifically described, and description of others may be omitted.

The configuration of the display device 200 according to the present embodiment differs from the configuration of the display device 100 according to the first embodiment in a layered structure of a bending region 102b. That is, in the display device 200 according to the present embodiment, a wiring 106 is provided on a first substrate 102 in the contact therewith in a bending region 102b.

When the display device 200 has such a configuration, an inorganic insulating layer does not exist under the wiring 106. Therefore, when the inorganic insulating layer is cracked, the wiring 106 is neither disconnected nor stripped with the cracking.

A method of manufacturing the display device 200 according to the present embodiment is substantially similar to the method of manufacturing the display device 100 according to the first embodiment, in which a first insulating layer 140 in the bending region 102b is removed before the wiring 106 is formed. When a second insulating layer 142 is patterned, for example, the first insulating layer 140 in the bending region 102b may be simultaneously removed.

<Third Embodiment>

Figure 9:
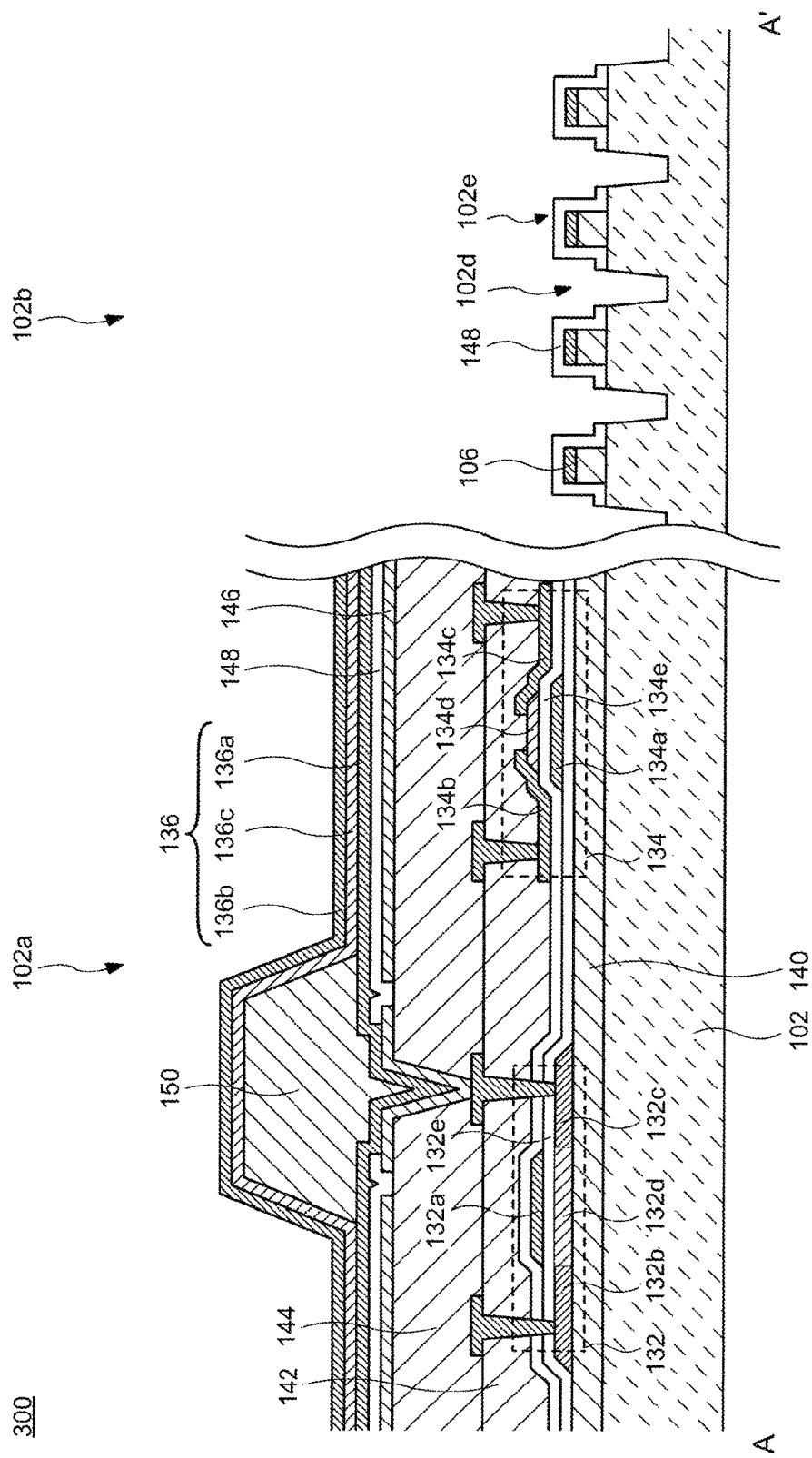
FIG. 9 is a cross-sectional view illustrating a configuration of a display device according to a third embodiment of the present invention.

A configuration of a display device 300 according to the present embodiment will be described with reference to FIG. 9. FIG. 9 is a cross-sectional view illustrating the configuration of the display device 300 according to the present embodiment. A difference between the display device 300 according to the present embodiment and the display device 100 according to the first embodiment will be specifically described, and description of others may be omitted.

The configuration of the display device 300 according to the present embodiment differs from the configuration of the display device 100 according to the first embodiment in a layered structure of a bending region 102b. That is, in the display device 300 according to the present embodiment, a third insulating layer 148 is provided to cover an upper surface and a side surface of a wiring 106 in the bending region 102b.

When the display device 300 is thus configured, there is no portion, in which the wiring 106 is exposed to the outside, in the bending region 102b so that its corrosion can be prevented.

<Fourth Embodiment>

Figure 10:
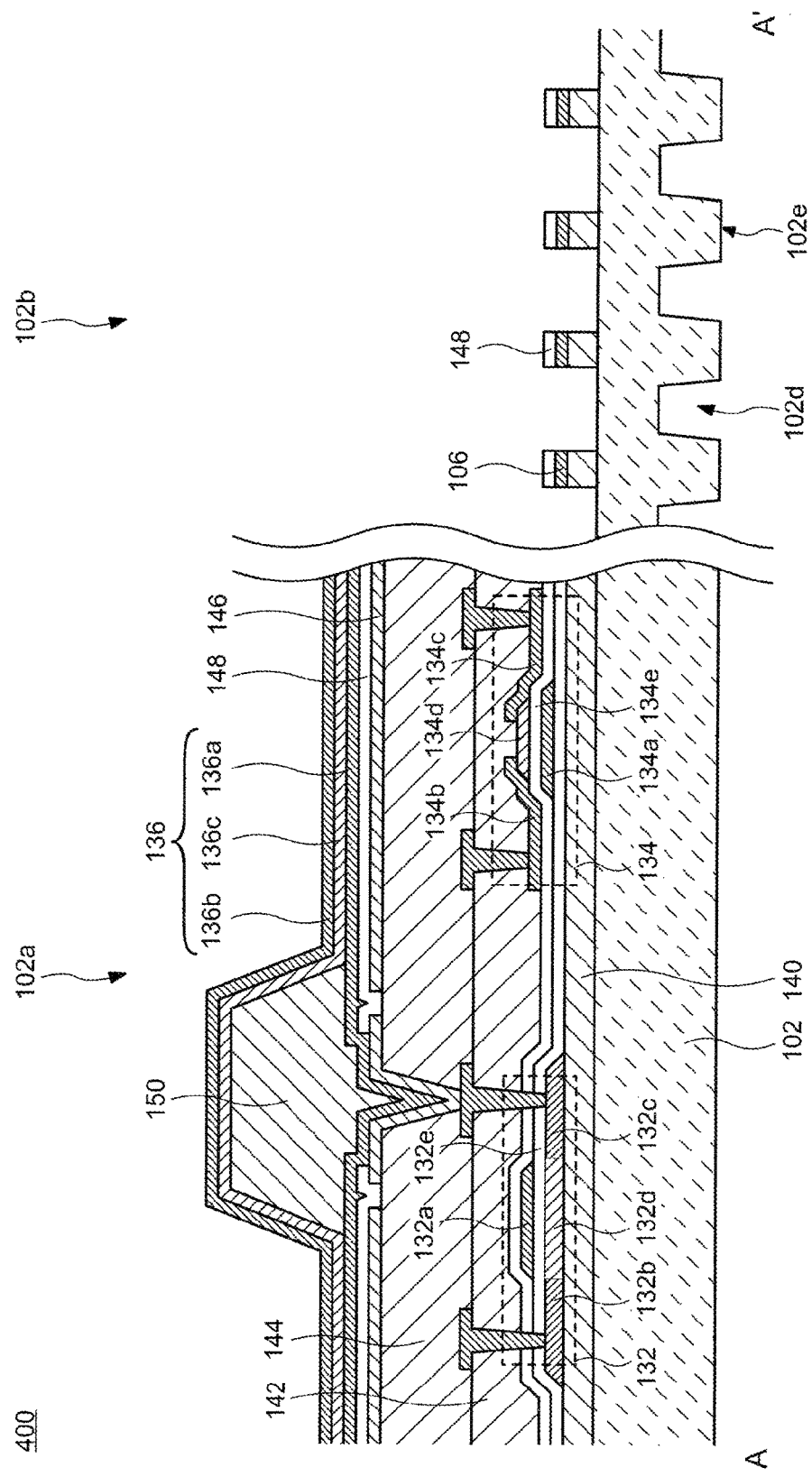
FIG. 10 is a cross-sectional view illustrating a configuration of a display device according to a fourth embodiment of the present invention.

A configuration of a display device 400 according to the present embodiment will be described with reference to FIG. 10. FIG. 10 is a cross-sectional view illustrating the configuration of the display device 400 according to the present embodiment. A difference between the display device 400 according to the present embodiment and the display device 100 according to the first embodiment will be specifically described, and description of others may be omitted.

The configuration of the display device 400 according to the present embodiment differs from the configuration of the display device 100 according to the first embodiment in a layered structure of a bending region 102b. That is, in the display device 400 according to the present embodiment, an uneven pattern is formed on a surface on the opposite side to a surface, on which pixels 108 are arranged, in the bending region 102b. A plurality of wirings 106 are arranged in a bottom part of a convex portion in the uneven pattern. The bottom part means a region opposing a top part of the convex portion on the surface on the opposite side to the surface, on which the uneven pattern is formed, of the substrate 102. That is, while the plurality of wirings 106 are arranged in the top part of the convex portion in the uneven pattern in the first embodiment, the plurality of wirings 106 are arranged on the opposite side to the top part of the convex portion in the uneven pattern in the present embodiment. Further, an insulating layer is arranged between the plurality of wirings 106 and the opposite side to the top part of the convex portion.

When the display device 300 is thus configured, there is no portion, in which the wiring 106 is exposed to the outside, in the bending region 102b so that its corrosion can be prevented.

<Fifth Embodiment>

Figure 11:
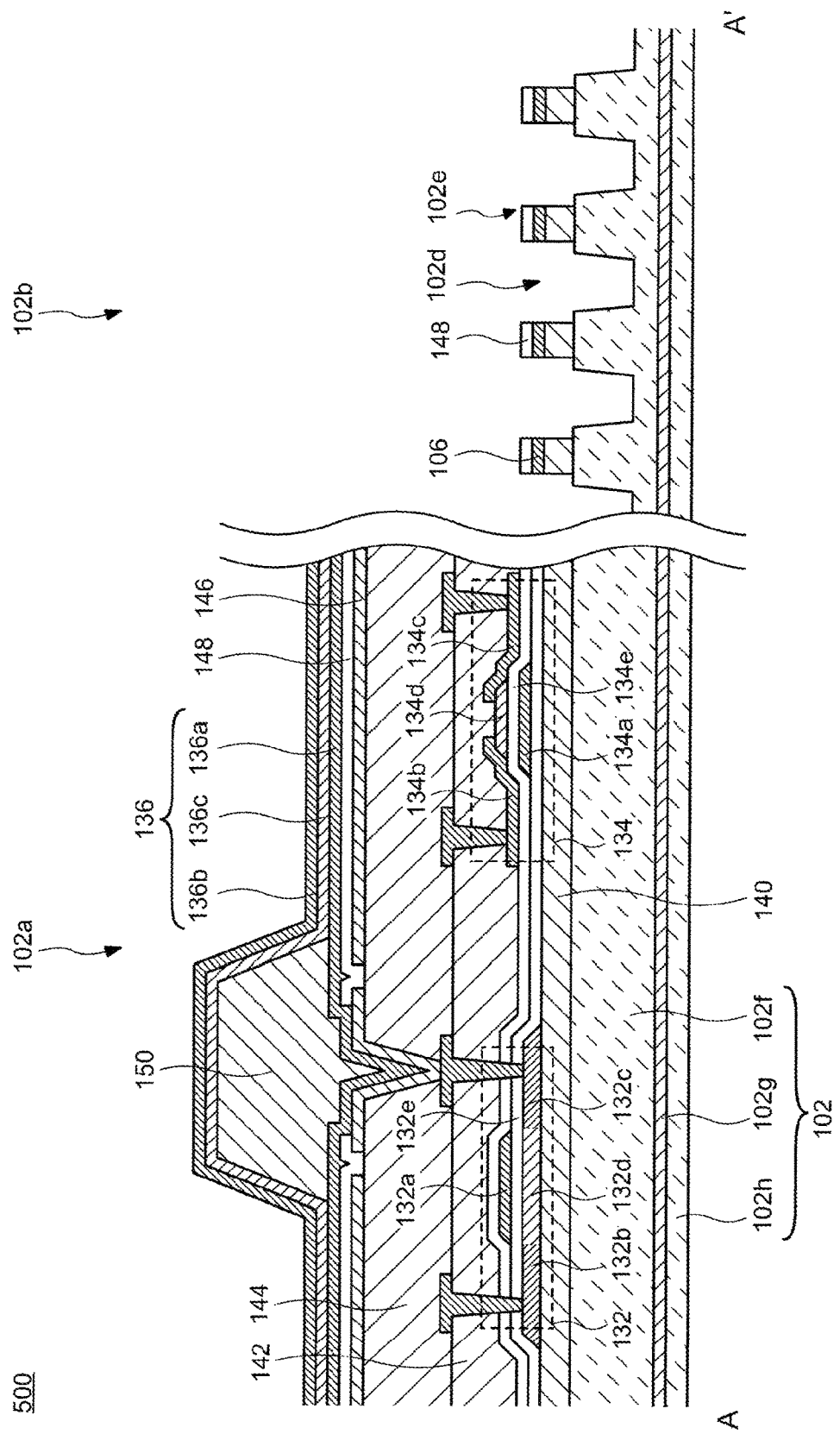
FIG. 11 is a cross-sectional view illustrating a configuration of a display device according to a fifth embodiment of the present invention.

A configuration of a display device 500 according to the present embodiment will be described with reference to FIG. 11. FIG. 11 is a cross-sectional view illustrating the configuration of the display device 500 according to the present embodiment. A difference between the display device 500 according to the present embodiment and the display device 100 according to the first embodiment will be specifically described, and description of others may be omitted.

The configuration of the display device 500 according to the present embodiment differs from the configuration of the display device 100 according to the first embodiment in a layered structure of a first substrate 102. That is, in the display device 500 according to the present embodiment, the first substrate 102 has a structure in which three insulating layers 102f, 102g, and 102h are stacked. As a stack of the three insulating layers, a structure in which an inorganic insulating layer is sandwiched between organic insulating layers, for example, can be used. A silicon nitride layer, for example, is used as the inorganic insulating layer, and polyimide, for example, can be used as the organic insulating layer.

When the display device 500 is thus configured, water can be effectively inhibited from entering pixels 108 from the side of a rear surface of the first substrate 102 in a display region 102a, and thus the pixels 108 can be inhibited from deteriorating.

When the display device 500 is thus configured, there is no portion, in which a wiring 106 is exposed to the outside, in a bending region 102b so that its corrosion can be prevented.

A preferred embodiment of the present invention has been described above with the first embodiment to the fifth embodiment. However, the embodiments are merely exemplary, and a technical scope of the present invention is not limited to those. Various alterations can be made by those skilled in the art without departing from the spirit of the invention. For example, the embodiments can also be optionally combined. Accordingly, the alterations are to be naturally construed as belonging to the technical scope of the present invention.

What is claimed is:

1. A method of manufacturing a display device, comprising:
   forming a plurality of wirings on a first surface of a flexible substrate, the substrate having the first surface and a second surface opposite to the first surface and including a first region and a second region, each of the plurality of wirings transmitting a signal for driving a plurality of pixels arranged in the first region; and
   forming an uneven pattern in the substrate by etching regions respectively corresponding to areas among the plurality of wirings from a side of the first surface or a side of the second surface in the second region,
   wherein each of the plurality of wirings is arranged to bend or meander in the second region.

2. The method of manufacturing the display device according to claim 1, further comprising
   folding the second region.

3. The method of manufacturing the display device according to claim 2, wherein
   the substrate includes a third region where a terminal is arranged,
   the second region is arranged between the first region and the third region, and
   the first region and the third region overlap each other when the second region is folded.

4. The method of manufacturing the display device according to claim 1, further comprising
   forming an insulating layer on the first surface of the substrate before forming the plurality of wirings.

5. The method of manufacturing the display device according to claim 4, further comprising
   removing the insulating layer in the second region before forming the plurality of wirings.

6. The method of manufacturing the display device according to claim 1, wherein
   a convex portion in the uneven pattern has a tapered shape.

* * * * *